(12) United States Patent
Ishii

(10) Patent No.: US 8,282,358 B2
(45) Date of Patent: Oct. 9, 2012

(54) FLUIDIC DEVICE

(75) Inventor: Itaru Ishii, Kirishima (JP)

(73) Assignee: Kyocera Corporation, Kyoto (JP)

( * ) Notice: Subject to any disclaimer, the term of this patent is extended or adjusted under 35 U.S.C. 154(b) by 1439 days.

(21) Appl. No.: 11/849,067

(22) Filed: Aug. 31, 2007

(65) Prior Publication Data

US 2008/0314456 A1 Dec. 25, 2008

(30) Foreign Application Priority Data

Aug. 31, 2006 (JP) .................................. 2006-234763
Aug. 31, 2007 (JP) .................................. 2007-227210

(51) Int. Cl.
*F04B 49/10* (2006.01)

(52) U.S. Cl. .............................. 417/18; 422/63; 137/271

(58) Field of Classification Search ................... 417/18; 422/63; 137/271
See application file for complete search history.

(56) References Cited

U.S. PATENT DOCUMENTS

| | | | |
|---|---|---|---|
| 5,120,199 A * | 6/1992 | Youngs et al. ................. | 417/18 |
| 5,580,523 A | 12/1996 | Bard | |
| 6,828,143 B1 | 12/2004 | Bard | |
| 6,969,489 B2 * | 11/2005 | Freeman ........................ | 422/504 |
| 2002/0064483 A1 | 5/2002 | Sando et al. | |
| 2004/0226821 A1 | 11/2004 | Schasfoort et al. | |
| 2005/0042149 A1 | 2/2005 | Bard | |
| 2005/0255003 A1 | 11/2005 | Summersgill | |
| 2008/0260542 A1 | 10/2008 | Nishikawa et al. | |

FOREIGN PATENT DOCUMENTS

| | | |
|---|---|---|
| JP | 10501167 A | 2/1998 |
| JP | 2001108619 A | 4/2001 |
| JP | 2001194373 A | 7/2001 |
| JP | 2002214241 A | 7/2002 |
| JP | 2004205372 A | 7/2004 |
| JP | 2004296724 A | 10/2004 |
| JP | 2004340962 A | 12/2004 |
| JP | 2005072420 A | 3/2005 |
| JP | 2005209752 A | 8/2005 |
| JP | 2005262382 A | 9/2005 |
| JP | 2005537916 A | 12/2005 |
| JP | 2006022807 A | 1/2006 |
| JP | 2006038657 A | 2/2006 |
| JP | 2006061823 A | 3/2006 |
| JP | 2006090910 A | 4/2006 |
| JP | 2007003386 A | 1/2007 |
| JP | 2007024551 A | 2/2007 |

* cited by examiner

*Primary Examiner* — Charles Freay
*Assistant Examiner* — Patrick Hamo
(74) *Attorney, Agent, or Firm* — DLA Piper LLP (US)

(57) ABSTRACT

There is provided a fluidic device that is small, that can reduce contamination inclusion, and that can improve efficiency. A fluidic device includes a first constituent member internally having a first channel, and a mounting substrate internally having a second channel, the first constituent member being mounted on the mounting substrate. The mounting substrate has a storage portion for storing a fluid which is supplied to the first channel and a collecting portion for storing a fluid which is discharged from the first channel. The second channel has a supplying channel portion connected to the storage portion and a collecting channel portion connected to the collecting portion. The supplying channel portion and the collecting channel portion are connected to each other via the first channel.

24 Claims, 12 Drawing Sheets

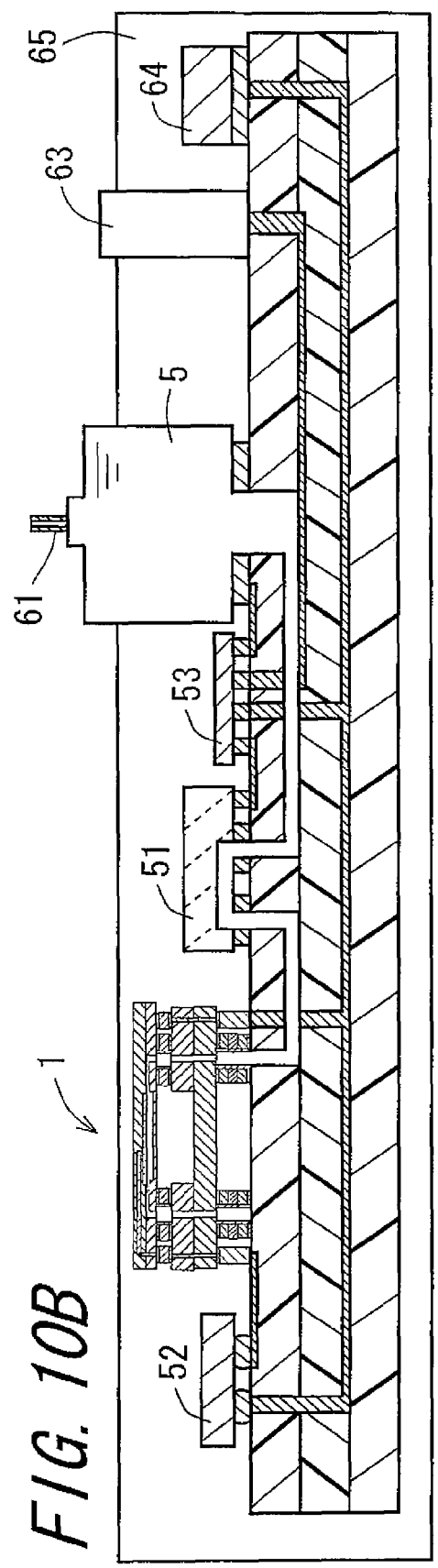

FLUIDIC DEVICE

CROSS-REFERENCE TO RELATED APPLICATIONS

This application claims the benefit of priority under 35 USC 119 of Japanese Patent Application No. 2006-234763, filed Aug. 31, 2006, and Japanese Patent Application No. 2007-227210, filed Aug. 31, 2007, which are incorporated herein by reference.

BACKGROUND OF THE INVENTION

1. Field of the Invention

The present invention relates to a fluidic device.

2. Description of the Related Art

For the purpose of achieving high precision and high efficiency in chemical analyses, fluidic devices referred to as microchemical chips, for example, are used that enable such operations to be performed in a micro size as measurement of potential, measurement of flow rate, and injection, discharge, and assessment of a sample necessary for chromatography and electrophoresis. A microchemical chip is provided with a substrate made of semiconductor or glass in which a channel is formed, a power source such as a micro pump to flow a fluid that is to be treated, to the channel, and a function portion for performing various measurements and analyses and syntheses on the fluid that is to be treated.

In a microchemical chip, a micro electromechanical system (hereinafter, referred to as an "MEMS") is used for performing a mechanical operation such as transportation of a sample. An MEMS has various components. As one example of the MEMS, there are sensors such as an accelerometer and a pressure sensor for detecting, for example, a change in pressure of a fluid, caused on a main face of a semiconductor substrate according to a chemical change. Other examples of the MEMS have a mechanism, for example, in which a micro pump is combined with a function portion of an optical device that includes a micro mirror device having a movable fine mirror member used for changing an optical axis in order to perform detection at high precision when optically detecting a change caused according to a chemical change. For example, a semiconductor device in which this MEMS is formed is connected to a channel substrate in which a channel is formed such that the MEMS is disposed in an inside portion of the channel, thereby forming a microchemical chip to flow a fluid through the channel and for analyzing the fluid flowing through the channel (see Japanese Unexamined Patent Publications JP-A 2002-214241 and JP-A 2001-108619, for example).

For example, in a conventional fluidic device serving as such a microchemical chip, a fluid is supplied from a separately provided supplying apparatus. The supplying apparatus is provided with a storage portion and ejecting means such as a nozzle, and a fluid stored in the storage portion is ejected from the ejecting means and supplied to the fluidic device. In this manner, in a conventional fluidic device, a storage portion of a fluid is separately provided. Accordingly, the fluid is exposed to the air between the storage portion and the fluidic device, so that foreign materials such as germs and dirt are mixed with the fluid, and thus there is a problem in that so-called contamination is included in a liquid. When the supplying apparatus and the fluidic device are connected to each other via a tube or the like, contamination inclusion can be reduced, but a tube is additionally required, and thus there is another problem in that the components of the entire fluid apparatus including the fluidic device become complicated and large.

Furthermore, in a case where a conventional fluidic device is used, it is difficult to make an apparatus small. Thus, a large apparatus is used, and the entire system through which a fluid becomes large. Accordingly, it is difficult to cause a fluid to flow in a small flow rate through the fluidic device, so that there are problems in that a large amount of the fluid is necessary and in that the efficiency becomes poor.

SUMMARY OF THE INVENTION

It is an object of the invention to provide a fluidic device that is small, that can reduce contamination inclusion and can be improved in efficiency due to allowing flow of a fluid in a small flow rate.

A fluidic device of the invention comprises a first constituent member internally having a first channel; and a mounting substrate internally having a second channel, the first constituent member being mounted on the mounting substrate. The mounting substrate has a first storage portion for storing a fluid which is supplied to the first channel and a second storage portion for storing a fluid which is discharged from the first channel. The second channel has a first part channel connected to the first storage portion and a second part channel connected to the second storage portion. The first part channel and the second part channel are connected to each other via the first channel. Hereinafter, this fluidic device is referred to as "a first fluidic device".

Preferably, in the first fluidic device, the first storage portion and the second storage portion are integrated. Hereinafter, this fluidic device is referred to as "a second fluidic device".

Preferably, in the first or second fluidic device, the mounting substrate has a pump to flow a fluid to the first channel and the second channel. Hereinafter, this fluidic device is referred to as "a third fluidic device".

Preferably, in the third fluidic device, the mounting substrate has a sensor to detect a quantity of state relating to a fluid in the first channel, and a controller to control a drive of the pump based on the quantity of state detected by the sensor. Hereinafter, this fluidic device is referred to as "a fourth fluidic device".

Preferably, in one of the first to fourth fluidic devices, the first channel internally has a detector to detect a state of the fluid or a predetermined component in the fluid. Hereinafter, this fluidic device is referred to as "a fifth fluidic device".

Preferably, in one of the first to fourth fluidic devices, the first channel internally has a fluid treating section for treating the fluid. Hereinafter, this fluidic device is referred to as "a sixth fluidic device".

Preferably, in one of the first to fourth fluidic devices, a target to be cooled by the fluid is placed inside or adjacent to the first channel. Hereinafter, this fluidic device is referred to as "a seventh fluidic device".

Preferably, in one of the first to seventh fluidic devices, the first constituent member has a first substrate and a second substrate; the first channel has a first inside channel portion formed inside the first substrate and a second inside channel portion formed inside the second substrate, the second inside channel portion having an introduction channel for introducing a fluid into the first inside channel portion, and a discharge channel for discharging a fluid from the first inside channel portion; and the first part channel and the introduction channel are connected to each other, and the discharge channel and the second part channel are connected to each other. Hereinafter, this fluidic device is referred to as "an eighth fluidic device".

Preferably, in one of the first to seventh fluidic devices, the first constituent member has a first substrate and a second substrate; a recess portion is formed on at least one of two mutually opposing surfaces of the first substrate and the second substrate; the first channel has a channel-portion-between-substrates constituted by the recess portion between the first substrate and the second substrate, and a second inside channel portion formed inside the second substrate; the second inside channel portion having an introduction channel for introducing a fluid into the channel-portion-between-substrates, and a discharge channel for discharging a fluid from the channel-portion-between-substrates; and the first part channel and the introduction channel are connected to each other, and the discharge channel and the second part channel are connected to each other. Hereinafter, this fluidic device is referred to as "a ninth fluidic device".

Preferably, one of the first to seventh fluidic devices comprises a first bonding portion for bonding the first constituent member and the mounting substrate to each other, and the first bonding portion has a first bonding member and a second bonding member, the first bonding member internally having a channel for connecting the first channel and the first part channel to each other, the second bonding member internally having a channel for connecting the first channel and the second part channel to each other. Hereinafter, this fluidic device is referred to as "a tenth fluidic device".

Preferably, the eighth fluidic device comprises a first bonding portion for bonding the second substrate and the mounting substrate to each other, and a second bonding portion for bonding the first substrate and the second substrate to each other, the first bonding portion having a first bonding member and a second bonding member, the second-bonding-portion-between-substrates having a third bonding member and a fourth bonding member, and the first bonding member internally has a channel for connecting the introduction channel and the first part channel to each other; the second bonding member internally has a channel for connecting the discharge channel and the second part channel to each other; the third bonding member internally has a channel for connecting the introduction channel and the first inside channel portion to each other; and the fourth bonding member internally has a channel for connecting the discharge channel and the first inside channel portion to each other. Hereinafter, this fluidic device is referred to as "an eleventh fluidic device".

Preferably, the ninth fluidic device comprises a first bonding portion for bonding the mounting substrate and the second substrate to each other, and a second bonding portion for bonding the first substrate and the second substrate to each other, the first bonding portion having a first bonding member and a second bonding member, the second bonding portion having a ring-shaped third bonding member, and the first bonding member internally has a channel for connecting the introduction channel and the first part channel to each other; the second bonding member internally has a channel for connecting the discharge channel and the second part channel to each other; and the third bonding member is formed so as to enclose the channel-portion-between-substrates. Hereinafter, this fluidic device is referred to as "a twelfth fluidic device".

Preferably, in the first fluidic device, the first constituent member has a first substrate and a second substrate, the first fluidic device comprises a first bonding portion for bonding the mounting substrate and the second substrate to each other; and a second bonding portion for bonding the second substrate and the first substrate, the first bonding portion having a first bonding member and a second bonding member, the second bonding portion having a ring-shaped third bonding member, and the first channel has a channel-portion-between-substrates constituted by a gap between the second substrate and the first substrate inside the third bonding member, and a second inside channel portion formed inside the second substrate, the second inside channel portion having an introduction channel for introducing a fluid into the first inside channel portion, and a discharge channel for discharging a fluid from the first inside channel portion, and the first bonding member internally has a channel for connecting the introduction channel and the first part channel to each other, and the second bonding member internally has a channel for connecting the discharge channel and the second part channel to each other. Hereinafter, this fluidic device is referred to as "a thirteenth fluidic device".

Preferably, one of the first to seventh and tenth fluidic devices comprises a first electrically connecting portion for electrically connecting the first constituent member and the mounting substrate to each other. Hereinafter, this fluidic device is referred to as "a fourteenth fluidic device".

Preferably, one of the eighth, ninth, and eleventh to thirteenth fluidic devices comprises a first electrically connecting portion for electrically connecting the mounting substrate and a second substrate to each other, and a second electrically connecting portion for electrically connecting the second substrate and the first substrate to each other. Hereinafter, this fluidic device is referred to as "a fifteenth fluidic device".

Preferably, the tenth fluidic device further comprises a first electrically connecting portion for electrically connecting the first constituent member and the mounting substrate, and the first bonding portion is integrated with the first electrically connecting portion. Hereinafter, this fluidic device is referred to as "a sixteenth fluidic device".

Preferably, one of the eleventh to thirteenth fluidic devices further comprises a first electrically connecting portion for electrically connecting the mounting substrate and the second substrate, and a second electrically connecting portion for electrically connecting the second substrate and the first substrate, and the first bonding portion is integrated with the first electrically connecting portion, and the second bonding portion is integrated with the second electrically connecting portion. Hereinafter, this fluidic device is referred to as "a seventeenth fluidic device".

Preferably, the tenth fluidic device further comprises a first electrically connecting portion for electrically connecting the first constituent member and the mounting substrate, and the first electrically connecting portion is disposed closer to an outer peripheral portion than the first bonding portion. Hereinafter, this fluidic device is referred to as "an eighteenth fluidic device".

Preferably, one of the eleventh to thirteenth fluidic devices further comprises a first electrically connecting portion for electrically connecting the mounting substrate and the second substrate, and a second electrically connecting portion for electrically connecting the second substrate and the first substrate, and the first electrically connecting portion is disposed closer to an outer peripheral portion than the first bonding portion, and the second electrically connecting portion is disposed closer to an outer peripheral portion than the second bonding portion. Hereinafter, this fluidic device is referred to as "a nineteenth fluidic device".

Preferably, in one of the eleventh to thirteenth fluidic devices, the second bonding portion is disposed closer to an outer peripheral portion than the first bonding portion when viewed from a plain surface. Hereinafter, this fluidic device is referred to as "a twentieth fluidic device".

Preferably, in one of the tenth to thirteenth and sixteenth to twentieth fluidic devices, the first bonding portion is made of a metal material. Hereinafter, this fluidic device is referred to as "a twenty-first fluidic device".

Preferably, in one of the eleventh to thirteenth, seventeenth, nineteenth and twentieth fluidic devices, the second bonding portion is made of a metal material. Hereinafter, this fluidic device is referred to as "a twenty-second fluidic device".

Preferably, in one of the tenth to thirteenth and eighteenth to twentieth fluidic devices, the first bonding portion is made of an insulating material. Hereinafter, this fluidic device is referred to as "a twenty-third fluidic device".

Preferably, in the sixteenth or seventeenth fluidic device, the first bonding portion is made of an insulating material, and has internal wiring as the first electrically connecting portion. Hereinafter, this fluidic device is referred to as "a twenty-fourth fluidic device".

Preferably, in one of the eleventh to thirteenth, nineteenth and twentieth fluidic devices, the second bonding portion is made of an insulating material. Hereinafter, this fluidic device is referred to as "a twenty-fifth fluidic device".

Preferably, in the seventeenth fluidic device, the first bonding portion is made of an insulating material, and has internal wiring as the first electrically connecting portion, and the second bonding portion is made of an insulating material, and has internal wiring as the second electrically connecting portion. Hereinafter, this fluidic device is referred to as "a twenty-sixth fluidic device".

Preferably, in one of the eleventh to thirteenth, nineteenth and twentieth fluidic devices, one of the first bonding portion and the second bonding portion is made of a metal material, and the other thereof is made of an insulating material. Hereinafter, this fluidic device is referred to as "a twenty-seventh fluidic device".

Preferably, in one of the tenth to thirteenth and sixteenth to twenty-seventh fluidic devices, a surface portion of the first bonding portion which is brought into contact with a fluid, is made of a corrosion-resistant member having corrosion resistance. Hereinafter, this fluidic device is referred to as "a twenty-eighth fluidic device".

Preferably, in one of the eleventh to thirteenth, seventeenth, nineteenth, twentieth, twenty-second and twenty-fifth fluidic devices, a surface portion of the second bonding portion which is brought into contact with a fluid, is made of a corrosion-resistant member having corrosion resistance. Hereinafter, this fluidic device is referred to as "a twenty-ninth fluidic device".

Preferably, in the twenty-eighth or twenty-ninth fluidic device, the corrosion-resistant member is made of a resin. Hereinafter, this fluidic device is referred to as "a thirtieth fluidic device".

Preferably, in one of the tenth to thirteenth and sixteen to thirtieth fluidic devices, the first bonding portion has a driving portion for driving a fluid to flow through the channel inside the first bonding portion. Hereinafter, this fluidic device is referred to as "a thirty-first fluidic device".

Preferably, in one of the eleventh to thirteenth, seventeenth, nineteenth, twentieth, twenty-second, twenty-fifth to twenty-seventh and twenty-ninth fluidic devices, the second bonding portion has a driving portion for driving a fluid to flow through the channel inside the second bonding portion. Hereinafter, this fluidic device is referred to as "a thirty-second fluidic device".

A component detecting method using the fifth fluidic device of the invention comprises a storage step of storing a fluid of interest which is subjected to detection; a fluid feeding step of feeding the stored fluid of interest; a component detection step of detecting a predetermined component in the fluid of interest; and a collection step of collecting the fluid of interest having been subjected to detection.

A fluid treating method of applying a predetermined treatment to a fluid using the sixth fluidic device of the invention comprises a storage step of storing a fluid of interest which is to be treated; a fluid feeding step of feeding the stored fluid of interest; a treatment step of applying a predetermined treatment to the fluid of interest; and a collection step of collecting the treated fluid of interest.

A fluid-state detecting method of detecting a state of a fluid using the fifth fluidic device of the invention comprises a storage step of storing a fluid of interest; a fluid feeding step of feeding the stored fluid of interest; a detection step of detecting a state of the fluid of interest; and a collection step of collecting the fluid of interest whose state has been detected.

Preferably, the component detecting method further comprises a detection step of detecting a state of external environment or a state of the fluid of interest, and in the fluid feeding step, a fluid feeding condition is regulated in accordance with the detected state.

Preferably, the fluid treating method further comprises a detection step of detecting a state of external environment or a state of the fluid of interest, and in the fluid feeding step, a fluid feeding condition is regulated in accordance with the detected state.

Preferably, the fluid-state detecting method further comprises a detection step of detecting a state of external environment or another state of the fluid of interest, and in the fluid feeding step, a fluid feeding condition is regulated in accordance with the detected state.

A cooling method of cooling a target to be cooled using the seventh fluidic device of the invention comprises a storage step of storing a fluid of interest which cools the target; a fluid feeding step of feeding the stored fluid of interest; and a collection step of collecting the fluid of interest having cooled the target.

BRIEF DESCRIPTION OF THE DRAWINGS

Other and further objects, features, and advantages of the invention will be more explicit from the following detailed description taken with reference to the drawings wherein:

FIG. 10B is a cross-sectional view showing the DNA detector;

DETAILED DESCRIPTION OF THE PREFERRED EMBODIMENTS

Figure 1:
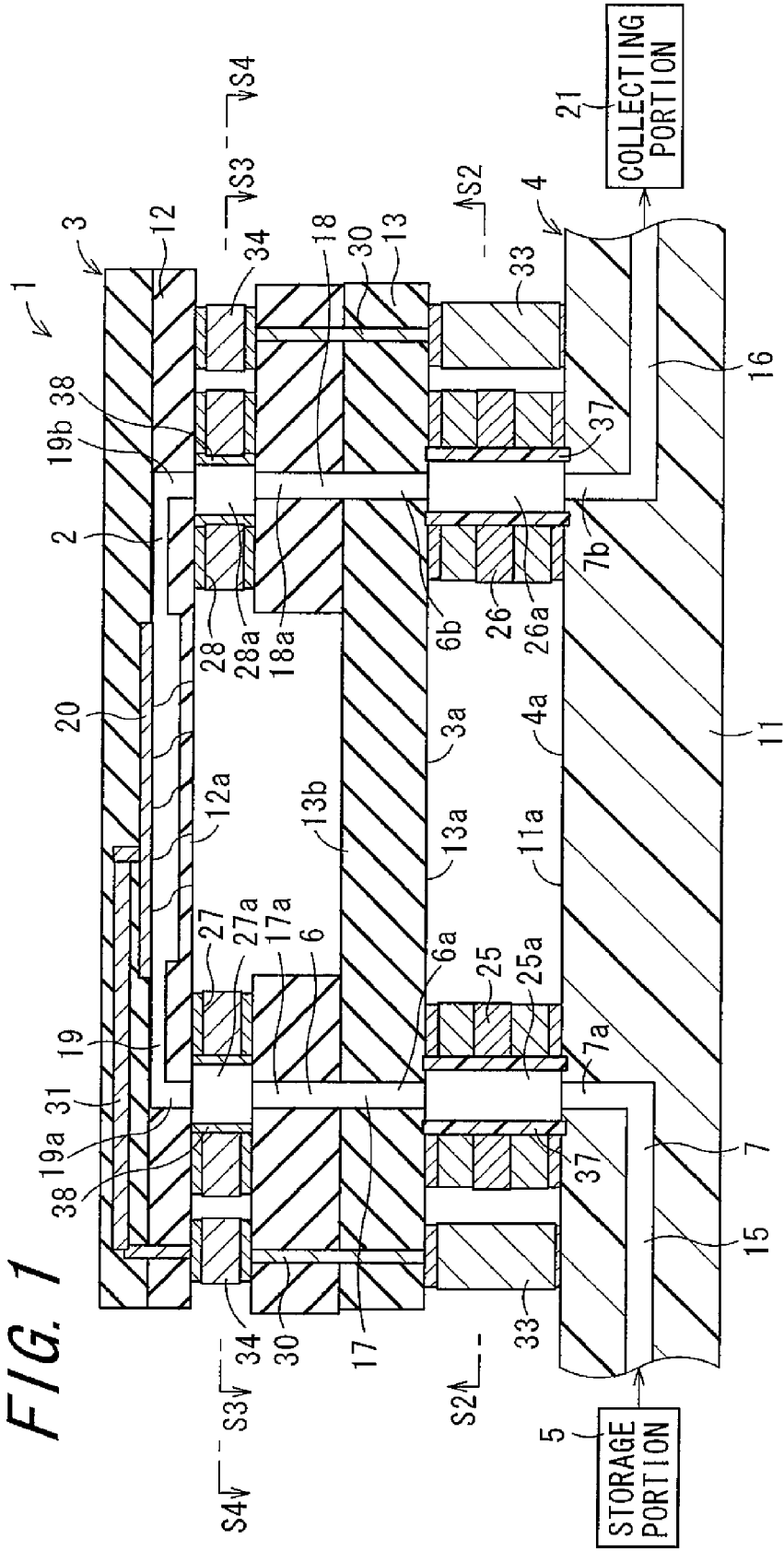
FIG. 1 is a cross-sectional view showing a fluidic device according to an embodiment of the invention.

Now referring to the drawings, preferred embodiments of the invention are described below.

FIG. 1 is a cross-sectional view showing a fluidic device 1 according to an embodiment of the invention. The fluidic device 1 is a device that is used to flow a fluid through an internal channel 2. The fluidic device 1 may be a sensing device to analyze and measure thereby acquiring information of a fluid, may be a fluid treating device for artificially treating a fluid, or may be a fluid utilizing device for utilizing a fluid thereby treating a target. The fluid may be a liquid, a gas, or a liquid containing solid components. There is no particular limitation thereon as long as a fluid is used.

The information of a fluid acquired by the sensing device may be chemical information such as information of the constituents of the fluid, or may be physical information such as information of the pressure of the fluid, for example. The sensing device may be realized as, for example, a biosensor to analyze the constituents of a fluid containing biomedical tissues. The treatment performed on a fluid in the fluid treating device may be chemical treatment, may be physical treatment, or may be a combination thereof. The fluid treating device may be realized as, for example, a micro reactor for chemically reacting a fluid thereby producing a substance. The treatment performed in the fluid utilizing device may be chemical treatment, may be physical treatment, or may be a combination thereof. For example, treatment may be performed in which a target is cooled by causing thermal exchange between the target and a fluid. The target may be a semiconductor device such as an IC chip. The fluid utilizing device may be, for example, a cooling device for cooling a semiconductor device. These applications are merely an example of applications of the fluidic device, and the fluidic device may be used also in other applications.

Furthermore, it would be appreciated that the fluidic devices include a device referred to as a microchemical chip. Furthermore, the fluidic devices including a microchemical chip may be provided with a micro electromechanical system (hereinafter, referred to as an "MEMS"), or may not be provided with the MEMS. It should be noted that the MEMS refers to an electromechanical system that is constituted by fine components (devices in micro and nano scales) fabricated using fine processing technology of semiconductors.

The fluidic device 1 is provided with a second constituent member 4 and a second constituent member 4, and is configured by bonding to mechanically connect the first and the second constituent members 3 and 4. The second constituent member 4 has a storage portion 5. The second constituent member 4 internally has a first channel 6. The second constituent member 4 has opening portions 6a and 6b connected to the first channel 6 in one main face 3a thereof. The second constituent member 4 has the storage portion 5 for storing a fluid, and internally has a second channel 7 through which a fluid supplied from the storage portion 5 flows. The second constituent member 4 has opening portions 7a and 7b connected to the second channel 7 in one main face 4a thereof. The opening portions 6a and 6b of the first channel 6 are connected to the opening portions 7a and 7b of the second channel 7. The first and the second channels 6 and 7 are connected to form the channel 2 in the fluidic device 1. A main face refers to a surface portion on one side in the thickness direction.

The second constituent member 4 is provided with a mounting substrate 11. The first constituent member 3 is provided with a first substrate 12 and a first second substrate 13. The mounting substrate 11, the first substrate 12 and second substrate 13 are stacked such that the second substrate 13 is disposed between the mounting substrate 11 and the second substrates 12, and are arranged such that the second substrate 13 is opposed to the mounting substrate 11, and such that the first substrate 12 is opposed to the first substrate 12 on the side opposite to the mounting substrate 11.

The mounting substrate 11 is a substrate serving as a base of the fluidic device 1, and is a printed board or a circuit board. One main face 11a of the mounting substrate 11 corresponds to the one main face 4a of the second constituent member 4. The mounting substrate 11 is disposed such that the one main face 11a is opposed to the second substrate 13. The second channel 7 is formed inside the mounting substrate 11. The mounting substrate 11 has opening portions connected to the second channel 7 in the one main face 11a thereof. These opening portions serve as the opening portions 7a and 7b in the one main face 4a of the second constituent member 4.

The mounting substrate 11 is provided with the storage portion 5. The storage portion 5 may be constituted by, for example, a recess or a space formed in the mounting substrate 11, or may be constituted by a container such as a tank mounted on the mounting substrate 11. The storage portion 5 is connected to the second channel 7, and a fluid is supplied from the storage portion 5 to the second channel 7. The mounting substrate 11 is constituted by, for example, a main body made of an insulating material such as an epoxy resin, and wiring lines made of a conductive material formed on the main body.

The second substrate 13 is provided such that one main face 13a is opposed to the one main face 11a of the mounting substrate 11. The first substrate 12 is provided such that one main face 12a is opposed to another main face 13b of the first substrate 12. The first substrate 12 and the second substrate 13 are bonded to be mechanically connected to each other. Of the first and the second substrates 12 and 13, the one main face 13a of the second substrate 13 serves as the one main face 3a of the first constituent member 3.

The first channel 6 is formed at least inside of the second substrate 13, of the first and the second substrates 12 and 13 constituting the first constituent member 3. In this embodiment, the first channel 6 is formed both inside of the second substrate 13 and inside of the first substrate 12. The first channel 6 has second inside channel portions 17 and 18 that are formed inside the second substrate 13, and a first inside channel portion 19 that is formed inside the first substrate 12. In this way, the first constituent member 3 having the first channel 6 has the first and the second substrate 12 and 13, and therefore the constitution of the second channel 7 can be selected with a high flexibility.

The second substrate 13 has opening portions connected to the second inside channel portions 17 and 18 in the one main face 13a thereof, and opening portions connected to the second inside channel portions 17 and 18 in the other main face 13b thereof. The first substrate 12 has opening portions connected to the first inside channel portion 19 in the one main face 12a thereof. Opening portions 17a and 18a in the other main face 13b of the second substrate 13, and opening portions 19a and 19b in the one main face 12a of the first substrate 12, are connected to form the first channel 6 inside the first and the second substrates 12 and 13. The opening portions in the one main face 13a of the second substrate 13 correspond to the opening portions 6a and 6b in the one main face 3a of the first constituent member 3, and are connected to the opening portions 7a and 7b of the mounting substrate 11. The opening portions 6a and 18a serve as a first introduction opening portion and a second introduction opening portion, and the opening portions 17a and 6b serve as a first discharge opening portion and a second discharge opening portion. Further, opening portions 27a and 28a as described later serve as a third introduction opening portion and a third discharge opening portion, and the opening portions 7a and 7b serve as a fourth introduction opening portion and a fourth discharge opening portion.

Both of the first and the second substrates 12 and 13 may be single-layered, or may be multi-layered. Alternately, one of the first and the second substrates 12 and 13 may be single-layered, and the other may be multi-layered. Furthermore, the first and the second substrates 12 and 13 are made of an insulating material such as a ceramic material, an organic resin material, or a composite material thereof. The first and the second substrates 12 and 13 may be made of the same material, or may be made of different materials.

Examples of the ceramic material include aluminum oxide-based sintered compacts, aluminum nitride-based sintered compacts, mullite-based sintered compacts, silicon carbide-based sintered compacts, silicon nitride-based sintered compacts, and glass ceramic sintered compacts. Examples of the organic resin material include polyimide, glass epoxy resins and phenol resins. Examples of the composite material include materials in which an inorganic powder such as ceramics and glass is bonded using an organic resin such as an epoxy resin. Furthermore, the first and the second substrates 12 and 13 may be made of a semiconductor material such as silicon, or may be made of glass.

For example, in a case where the first and the second substrates 12 and 13 are made of an aluminum oxide-based sintered compact, the first and the second substrates 12 and 13 are formed by layering a plurality of green sheets made of a raw material powder such as aluminum oxide powder and glass powder in the form of sheets, and then firing the layered sheets. Materials of the first and the second substrates 12 and 13 are not limited to an aluminum oxide-based sintered compact, and it is preferable to select a suitable material according to, for example, the applications of the fluidic device 1. For example, in a case where an MEMS 20 is provided as described later, it is preferable to select a suitable material of the first and the second substrates 12 and 13 according to the characteristics of the MEMS 20.

As materials of the mounting substrate 11, the first substrate 12 and the second substrate 13, it is preferable to select a suitable material in terms of corrosion resistance and the like, according to the characteristics of a fluid flowing through the first and the second channels 6 and 7. Furthermore, since the mounting substrate 11, the first substrate 12 and the second substrate 13 are mechanically connected to each other, and are electrically connected to each other as described later, it is preferable to select the materials of the mounting substrate 11, the first substrate 12 and the second substrate 13 such that thermal stress caused by a difference in the coefficient of thermal expansion between the mounting substrate 11, the first substrate 12 and the second substrate 13 is small, and to select the materials of the mounting substrate 11, the first substrate 12 and the second substrate 13 such that a difference in the coefficient of thermal expansion between the substrates connected to each other is small.

Furthermore, for example, in a case where wiring is formed on the mounting substrate 11, the first substrate 12 and the second substrate 13, then in order to prevent delay of electric signals transmitted via the wiring, it is preferable to use materials having small specific dielectric constant. Examples of such materials include: an organic resin material such as polyimide, a glass epoxy resin and a phenol resin; a composite material such as a material in which an inorganic powder such as ceramics and glass is bonded using an organic resin such as an epoxy resin; and an aluminum oxide/borosilicate glass-based, a lithium oxide-based, and other glass ceramic sintered compacts. Furthermore, for example, in a case where the mounting substrate 11, the first substrate 12 and the second substrate 13 are provided with a heat generating source such as the MEMS 20, then in order to release heat generated in the heat generating source well to the outside, it is preferable to use materials having large thermal conductivity, such as an aluminum nitride-based sintered compact or a resin material containing a large amount of filler.

As the opening portions 7a and 7b in the one main face 4a of the second constituent member 4, the mounting substrate 11 has a discharge opening portion 7a for discharging a fluid from the second channel 7, and an introduction opening portion 7b for introducing a fluid into the second channel 7. The second channel 7 has a supplying channel portion 15 and a collecting channel portion 16. One end portion of the supplying channel portion 15 is connected to the storage portion 5. The mounting substrate 11 has an opening portion connected to the supplying channel portion 15 in the one main face 11a thereof, and this opening portion serves as the fourth discharge opening portion 7a. One end portion of the collecting channel portion 16 is connected to a collecting portion 21. The mounting substrate 11 has an opening portion connected to the collecting channel portion 16 in the one main face 11a thereof, and this opening portion serves as the fourth introduction opening portion 7b.

The collecting portion 21 is for collecting and storing a fluid discharged from the first channel 6. The storage portion 5 may also serve as the collecting portion 21, and a fluid supplied from the storage portion 5 may be circulated inside the fluidic device 1 through the first and the second channels 6 and 7, and then collected by the storage portion 5. Alternately, the collecting portion 21 may be provided as a different component from the storage portion 5. It is possible to select a suitable configuration according to, for example, the applications of the fluidic device 1.

As the opening portions 6a and 6b in the one main face 3a of the first constituent member 3, the second substrate 13 has an introduction opening portion 6a for introducing a fluid into the first channel 6, and a discharge opening portion 6b for discharging a fluid from the first channel 6. The two second inside channel portions 17 and 18 are formed in the second substrate 13. Each of the second inside channel portions 17 and 18 is formed so as to pass through the second substrate 13 in the thickness direction.

The opening portion in the one main face 13a of the second substrate 13 serves as the first introduction opening portion 6a for introducing a fluid into the one second inside channel portion 17 (occasionally referred to as "an introduction channel") in order to introduce the fluid into the first channel 6. The opening portion in the other main face 13b of the second substrate 13 serves as the first discharge opening portion 17a for discharging a fluid from the one second inside channel portion 17. The opening portion in the one main face 13*a* of the second substrate 13 serves as the second discharge opening portion 6*b* for discharging a fluid from the other second inside channel portion 18 (occasionally referred to as "a discharge channel") in order to discharge the fluid from the first channel 6. The opening portion in the other main face 13*b* of the second substrate 13 serves as the second introduction opening portion 18*a* for introducing a fluid into the other second inside channel portion 18.

The first substrate 12 has two opening portions in the one main face 12*a* thereof. Of the two opening portions connected to the first inside channel portion 19, one opening portion serves as the third introduction opening portion 19*a* for introducing a fluid into the first inside channel portion 19, and the other opening portion serves as the third discharge opening portion 19*b* for discharging a fluid from the first inside channel portion 19.

The fourth discharge opening portion 7*a* and the first introduction opening portion 6*a* are connected. The second discharge opening portion 6*b* and the fourth introduction opening portion 7*b* are connected. The first discharge opening portion 17*a* and the third introduction opening portion 19*a* are connected. The third discharge opening portion 19*b* and the second introduction opening portion 18*a* are connected. In this manner, the supplying channel portion 15, the collecting channel portion 16, the second inside channel portions 17 and 18, and the first inside channel portion 19 are connected to form the channel 2.

The fluidic device 1 in which the channel 2 having the first and the second channels 6 and 7 is formed in this manner includes a composite substrate and the storage portion 5, the composite substrate being configured by bonding the mounting substrate 11, the first substrate 12 and the second substrate 13 in which the channel portions 15 to 19 as described above are formed. More specifically, the remaining portion obtained by excluding the storage portion 5 from the fluidic device 1 corresponds to the composite substrate.

In the fluidic device 1, the mounting substrate 11 constituting the second constituent member 4 is provided with the storage portion 5 and the collecting portion 21, and the fluidic device 1 is provided with the entire system through which a fluid flows. Thus, it is not necessary to provide a configuration for supplying a fluid, outside the fluidic device 1. Accordingly, a small fluidic device 1 can be realized. Furthermore, a fluid is prevented from being exposed to the outside air between the storage portion 5, the collecting portion 21 and the first and the second channels 6 and 7, and thus contamination inclusion caused by foreign substances mixed in the fluid can be reduced. The system through which a fluid flows refers to a system having the storage portion 5, the collecting portion 21 and the first and the second channels 6 and 7.

Moreover, the system through which a fluid flows can be made small, the volume of a fluid required can be reduced, and a small amount of fluid can be handled. Thus, a small amount of driving force suffices to cause a fluid to flow, a small amount of fluid can flow in a small flow rate, and a fluidic device apparatus with high efficiency can be realized. Furthermore, the first channel 6 is constituted by the channel portions 17 to 19 that are formed inside the first and the second substrates 12 and 13, and thus the volume of the entire first channel 6 can be reduced. Accordingly, the volume of a fluid can be reduced possible.

Furthermore, the first and the second channels 6 and 7 constitute the channel 2 in which a fluid supplied from the storage portion 5 flows from the supplying channel portion 15 of the second channel 7 via the one second inside channel portion 17 to reach this first inside channel portion 19, then from the first inside channel portion 19 via the other second inside channel portion 18 to return to the collecting channel portion 16 of the second channel 7, and is collected by the collecting portion 21. In this manner, a fluid can flow so as to be supplied from the storage portion 5 to the second channel 7, flow through the first channel 6 and the second channel 7, and then return to the collecting portion 21, that is, so as to flow from the mounting substrate 11 via the second substrate 13 to be sent to the first substrate 12, and then from the first substrate 12 via the second substrate 13 to return to the mounting substrate 11. In this manner, a fluid can flow in one direction, and the fluid can flow smoothly through the first and the second channels 6 and 7, and thus the efficiency can be improved.

Figure 2:
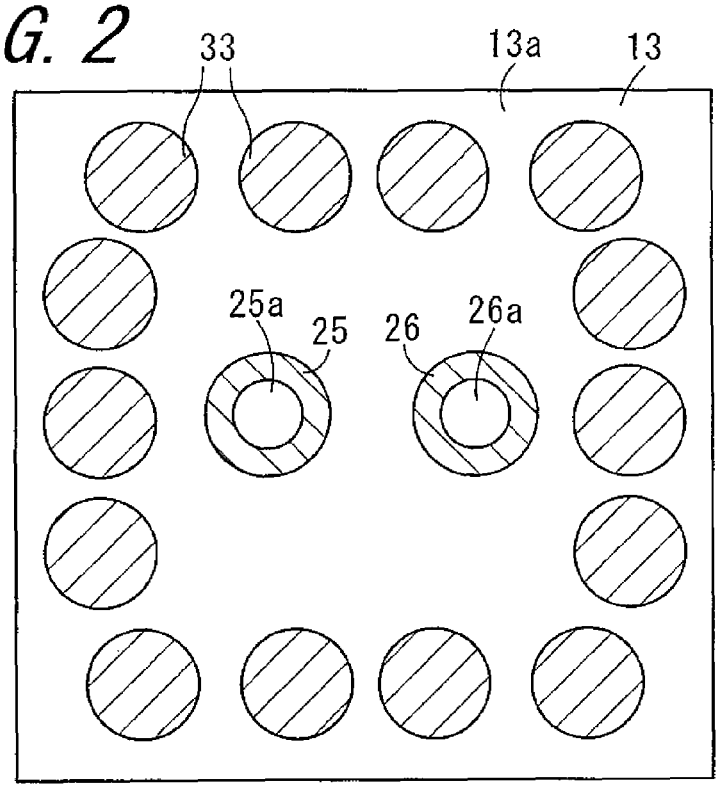
FIG. 2 is a simplified cross-sectional view showing the structure connecting the mounting substrate and the second substrate, viewed from a cutting plane line S2-S2 in FIG. 1.
Figure 3:
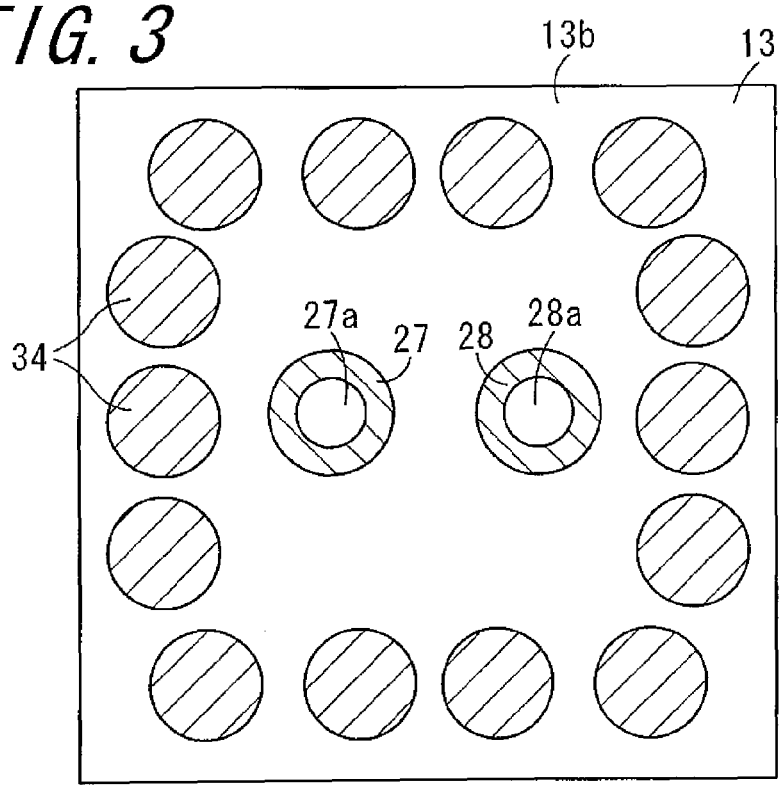
FIG. 3 is a simplified cross-sectional view showing the structure connecting the first and the second substrates, viewed from a cutting plane line S3-S3 in FIG. 1.

FIG. 2 is a simplified cross-sectional view showing the structure connecting the mounting substrate 11 and the second substrate 13, viewed from a cutting plane line S2-S2 in FIG. 1. FIG. 3 is a simplified cross-sectional view showing the structure connecting the first and the second substrates 12 and 13, viewed from a cutting plane line S3-S3 in FIG. 1. Referring to FIGS. 1 to 3, the fluidic device 1 is provided with a first bonding member 25 and a second bonding member 26 as a first bonding portion for bonding the mounting substrate 11 and the second substrate 13. Each of the first and the second bonding members 25 and 26 is a bonding member for bonding the first constituent member 3 and the second constituent member 4, and bonds the one main face 11*a* of the mounting substrate 11 and the one main face 13*a* of the second substrate 13.

The first and the second bonding members 25 and 26 are each in the shape of a cylinder, and respectively have connecting channels 25*a* and 26*a* for connecting the first channel 6 and the second channel 7. The first bonding member 25 uses the connecting channel 25*a* to connect the fourth discharge opening portion 7*a* and the first introduction opening portion 6*a*. The second bonding member 26 uses the connecting channel 26*a* to connect the fourth introduction opening portion 7*b* and the second discharge opening portion 6*b*.

Furthermore, the fluidic device 1 is provided with a third bonding member 27 and a fourth bonding member 28 as a second-bonding-portion-between-substrates for bonding the first substrate 12 and the second substrate 13. Each of the third and the fourth bonding members 27 and 28 is a bonding member for bonding the one main face 12*a* of the first substrate 12 and the other main face 13*b* of the second substrate 13.

The third and the fourth bonding members 27 and 28 are each in the shape of a cylinder, and respectively have connecting channels 27*a* and 28*a* for connecting the second inside channel portions 17 and 18 and the first inside channel portion 19. The third bonding member 27 uses the connecting channel 27*a* to connect the first discharge opening portion 17*a* and the third introduction opening portion 19*a*. The fourth bonding member 28 uses the connecting channel 28*a* to connect the second introduction opening portion 18*a* and the third discharge opening portion 19*b*.

In this manner, the connecting channels 25*a* and 26*a* are formed respectively in the first and the second bonding members 25 and 26 for mechanically connecting the mounting substrate 11 the second substrate 13. Accordingly, mechanical connection between the mounting substrate 11 and the second substrate 13, and connection of each of the second inside channel portions 17 and 18 to the second channel 7 are realized with the same member. Furthermore, the connecting channels 27*a* and 28*a* are formed respectively in the third and the fourth bonding members 27 and 28 for mechanically connecting the first and the second substrates 12 and 13.

Accordingly, mechanical connection between the first and the second substrates 12 and 13, and connection of the first inside channel portion 19 to each of the second inside channel portions 17 and 18 are realized with the same member. In this manner, the number of components can be reduced, and the configuration of the fluidic device 1 can be made simple. Also, the number of steps in the connecting operation can be reduced, so that the fluidic device 1 can be produced easily. Furthermore, the second inside channel portions 17 and 18 and the first inside channel portion 19 are connected via the connecting channels 27a and 28a of the third and the fourth bonding members 27 and 28, and thus a fluid can be prevented from being exposed to the outside air between the first substrate 12 and the second substrate 13, and thus contamination inclusion caused by foreign substances mixed in the fluid can be reduced.

Referring to FIG. 1, the first substrate 12 is provided with the MEMS 20. For example, the MEMS 20 may be provided as a sensor portion for detecting acceleration and pressure, may be provided as an optical processing portion such as a micro mirror device having a movable fine mirror member for performing optical processes such as fluorescent label emission of DNA and detection thereof, or may be provided as a mechanism portion for performing at least one of chemical treatment such as causing hybridization and polymerase chain reaction (PCR) on a fluid, so-called chemical synthesis such as hydrogen formation, and physical treatment such as mixing and separation, agitation, and heating and cooling of a liquid. For example, the MEMS 20 may be DNA chips arranged in the form of an array using the MEMS technology, cause a hybridization reaction with DNAs in a fluid, and output results of the reaction as a change in potential or a fluorescent label. With this configuration, DNAs in the fluid can be identified and evaluated. The MEMS 20 is provided, for example, so as to be exposed midway through the first inside channel portion 19.

Wiring conductors (not shown) are formed on the one main face 11a of the mounting substrate 11, the main faces 13a and 13b of the second substrate 13, and the one main face 12a of the first substrate 12. The wiring conductors on the main faces 13a and 13b of the second substrate 13 are electrically connected to each other via through-wiring 30 passing through the second substrate 13 in the thickness direction. The wiring conductor on the one main face 12a of the first substrate 12 is electrically connected, via internal wiring 31 formed inside the first substrate 12, to the MEMS 20.

Referring to FIGS. 1 to 3, the fluidic device 1 is provided with one or a plurality of first electrically connecting portions 33. In this embodiment, ten first electrically connecting portions 33 are provided. Each of the first electrically connecting portions 33 is a member for electrically connecting the first constituent member 3 and the second constituent member 4, and electrically connects the wiring conductor on the one main face 11a of the mounting substrate 11 and the wiring conductor on the one main face 13a of the second substrate 13.

Furthermore, the fluidic device 1 is provided with one or a plurality of second electrically connecting portions 34. In this embodiment, ten second electrically connecting portions 34 are provided. Each of the second electrically connecting portions 34 electrically connects the wiring conductor on the other main face 13b of the second substrate 13 and the wiring conductor on the one main face 12a of the first substrate 12.

In this manner, the wiring conductors are provided on the mounting substrate 11, the first substrate 12 and the second substrate 13, and the first and the second electrically connecting portions 33 and 34 for electrically connecting these wiring conductors are provided, so that the mounting substrate 11, the first substrate 12 and the second substrate 13 are electrically connected. Accordingly, the mounting substrate 11, the first substrate 12 and the second substrate 13 can be electrically connected to an external circuit provided outside the fluidic device 1. The external circuit may be mounted on the one main face 11a of the mounting substrate 11, for example.

The wiring conductor of the mounting substrate 11 connected via each first electrically connecting portion 33 is formed on the main face 11a provided with the opening portions 6a and 6b of the mounting substrate 11. The wiring conductor of the second substrate 13 connected via each first electrically connecting portion 33 is formed on the main face 13a provided with the opening portions 6a and 6b.

Accordingly, using the first and the second bonding members 25 and 26, mechanical connection between the mounting substrate 11 and the second substrate 13, and connection between the channel portions 15 and 16 of the mounting substrate 11 and the channel portions 17 and 18 of the second substrate 13 can be obtained, and at the same time, electrical connection between the mounting substrate 11 and the second substrate 13 can be obtained. Moreover, this connection can be obtained in a connection form referred to as, for example, surface mounting, and thus it is possible to easily obtain connection between the channel portions 15 to 18 of the mounting substrate 11 and the second substrate 13, and mechanical and electrical connection between the mounting substrate 11 and the second substrate 13.

The wiring conductor of the second substrate 13 connected via each second electrically connecting portion 34 is formed on the main face 13b provided with the opening portions 17a and 18a of the second substrate 13. The wiring conductor of the first substrate 12 connected via each second electrically connecting portion 34 is formed on the main face 12a of the first substrate 12.

Accordingly, using the third and the fourth bonding members 27 and 28, mechanical connection between the first and the second substrates 12 and 13, and connection between the channel portions 17 and 18 of the second substrate 13 and the channel portion 19 of the first substrate 12 can be obtained, and at the same time, electrical connection between the first and the second substrates 12 and 13 can be obtained. Moreover, this connection can be obtained in a connection form referred to as, for example, surface mounting, and thus it is possible to easily obtain connection between the channel portions 17 to 19 of the first and the second substrates 12 and 13, and mechanical and electrical connection between the first and the second substrates 12 and 13.

Each of the wiring conductors, the through-wiring 30, and the internal wiring 31 is made of a conductive material, for example, a metal material such as copper, silver, gold, palladium, tungsten, molybdenum, manganese, and nickel. Furthermore, the conductive material may be a material containing one or more of these metal materials. Each of the wiring conductors, the through-wiring 30, and the internal wiring 31 is realized with a metal thin film and can be formed by, for example, attaching the metal thin film using a thin film method such as plating or vapor deposition, a thick film method, and a metallizing method including a co-firing method. For example, in a case where a tungsten thin film is formed as a wiring conductor using the metallizing method, a paste of tungsten is printed on green sheets that are to be the substrates 11 to 13, and is fired together with the green sheets.

Each of the first and the second electrically connecting portions 33 and 34 is made of a conductive material, for example, tin/silver-based, tin/silver/copper-based, tin/antimony-based and other solders, gold/tin and other low-melting waxes, silver/germanium-based and other high-melting waxes, conductive organic resins, and metal materials that can be bonded using a welding method such as seam welding and electron beam welding.

Figure 4:
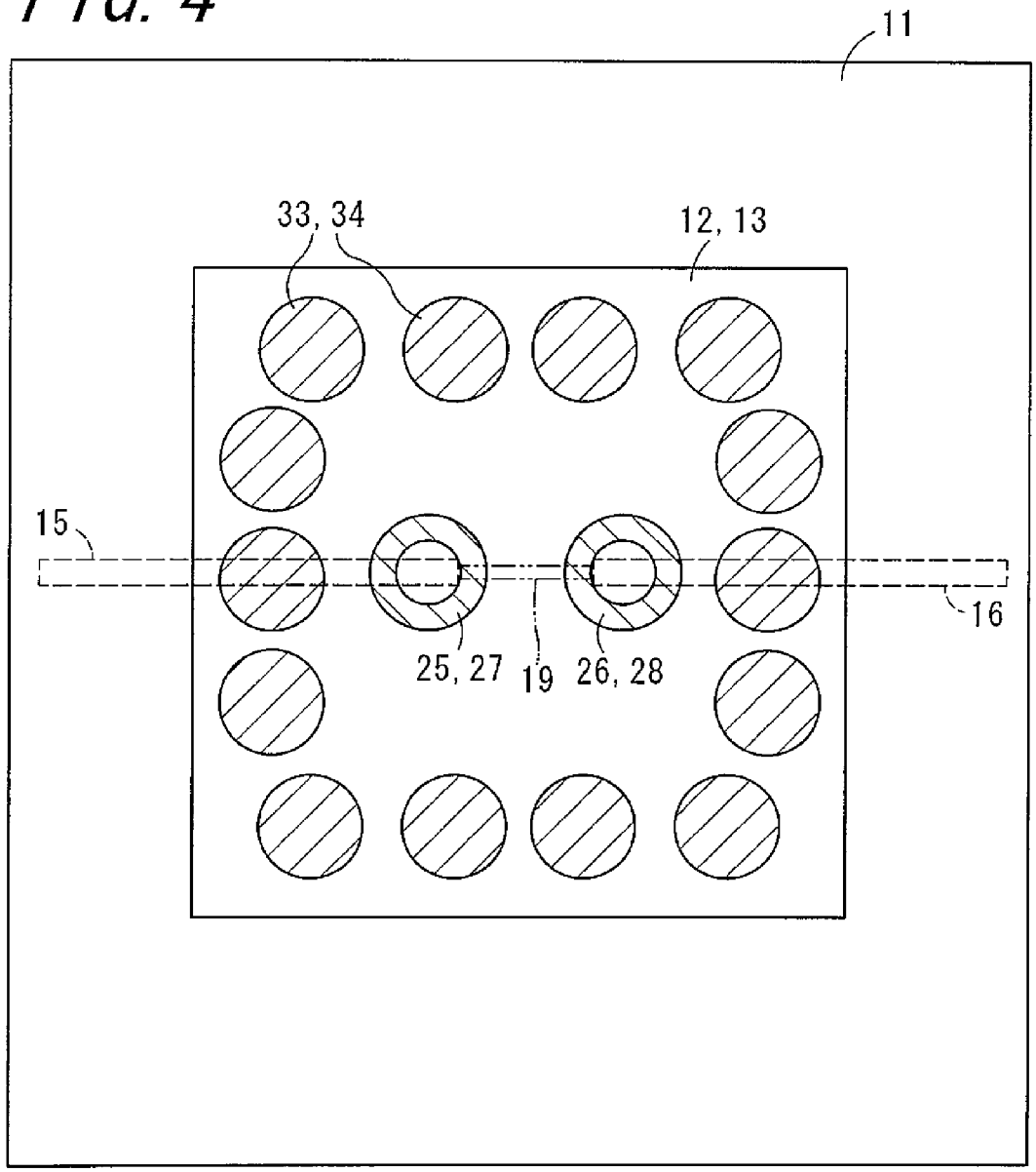
FIG. 4 is a simplified cross-sectional view showing the arrangement of the constituent portions, viewed from a cutting plane line S4-S4 in FIG. 1.

FIG. 4 is a simplified cross-sectional view showing the arrangement of the constituent portions, viewed from a cutting plane line S4-S4 in FIG. 1. In the following description, plan view refers to projection in a projecting direction that is the thickness direction of the mounting substrate 11, the first substrate 12 and the second substrate 13. Referring to FIGS. 1 to 4, for example, in plan view, the mounting substrate 11 is in the shape of a rectangle, and the length of one side is approximately several tens of mm. For example, in plan view, the first and the second substrates 12 and 13 have the same shape and size, and are in the shape of a rectangle that can be accommodated within the area of the mounting substrate 11, and the length of one side is 2 mm to 20 mm. Herein, rectangles include squares.

In plan view, the first bonding member 25 and the third bonding member 27 are coaxially provided so as to have the same central position, and coaxial with the one second inside channel portion 17. Furthermore, in plan view, the second bonding member 26 and the fourth bonding member 28 are coaxially provided so as to have the same central position, and coaxial with the other second inside channel portion 18.

In plan view, the first and the second channels 6 and 7 are formed so as to extend in the shape of a straight line, by connecting a portion that is comparatively close to the fourth discharge opening portion 7a in the supplying channel portion 15, and a portion that is spaced away therefrom and comparatively close to the fourth introduction opening portion 7b in the collecting channel portion 16, via the first inside channel portion 19.

In the first and the second channels 6 and 7, a channel cross section that is perpendicular to the direction in which a fluid flows may be in the shape of a circle or a rectangle. In a case where the channel cross section of the second channel 7 is in the shape of a circle, then the inner diameter is 100 µm to several hundreds of µm. In a case where the channel cross section is in the shape of a rectangle, then the length of one side on this cross section is 100 µm to several hundreds of µm. In a case where the channel cross section of each of the second inside channel portions 17 and 18 of the first channel 6 is in the shape of a circle, then the inner diameter is 30 µm to 300 µm. In a case where the channel cross section is in the shape of a rectangle, then the length of one side on this cross section is 30 µm to 300 µm. In a case where the channel cross section of the first inside channel portion 19 of the first channel 6 in the shape of a circle, then the inner diameter is 5 µm to 50 µm. In a case where the channel cross section is in the shape of a rectangle, then the length of one side on this cross section is 5 µm to 50 µm.

As described above, generally, the second channel 7 has a channel cross-sectional area larger than those of the second inside channel portions 17 and 18 and the first inside channel portion 19 of the first channel 6, and each of the second inside channel portions 17 and 18 of the first channel 6 has a channel cross-sectional area larger than that of the first inside channel portion 19. With this configuration, a fluid can be efficiently handled with the MEMS 20, and the amount of a liquid required can be reduced. The configuration is not limited to this configuration in which the channel cross-sectional area of the first inside channel portion 19 is small, and it is also possible to apply a configuration in which the channel cross-sectional area is uniform throughout the entire first and the second channels 6 and 7, or a configuration in which conversely, the channel cross-sectional area of the first inside channel portion 19 is large.

Furthermore, the first and the second channels 6 and 7 may meander in plan view. In particular, a configuration may be applied in which the first inside channel portion 19 meanders and thus the contact area between a fluid and the MEMS 20 is increased.

In plan view, the first and the second bonding members 25 and 26 are arranged closer to the center of the second substrate 13, and the first electrically connecting portions 33 are arranged in the shape of a ring at an inner peripheral portion closer to the center of the second substrate 13, and enclose the first and the second bonding members 25 and 26. The first electrically connecting portions 33 are each in the shape of, for example, a column with an outer diameter of 100 µm to 300 µm, and are arranged such that a pitch, which is the distance between the axial lines of the first electrically connecting portions 33, is 90 µm to 350 µm. Herein, the pitch of the first electrically connecting portions 33 is 350 µm or less, because with this pitch, electromagnetic waves from the outside can be blocked with the first electrically connecting portions 33. In order to block electromagnetic waves with the first electrically connecting portions 33, the pitch of the first electrically connecting portions 33 is to be ¼ or less of wavelength λ of electromagnetic waves. The wavelength λ of electromagnetic waves refers to wavelength in a case where the wavelength of electromagnetic waves from the outside has been apparently changed according to the dielectric constant of the first electrically connecting portions 33. More specifically, in a case there the pitch of the first electrically connecting portions 33 is smaller than λ/4, then irradiation of electromagnetic waves from the outside of the fluidic device 1 onto the first and the second bonding members 25 and 26 can be suppressed. It should be noted that all outer diameters of the first electrically connecting portions 33 may be the same or different, and pitches thereof may be uniform or different.

In plan view, the third and the fourth bonding members 27 and 28 are arranged closer to the center of the first and the second substrates 12 and 13, and the second electrically connecting portions 34 are arranged in the shape of a ring at an inner peripheral portion closer to the center of the first and the second substrates 12 and 13, and enclose the third and the fourth bonding members 27 and 28. The second electrically connecting portions 34 are each in the shape of, for example, a column with an outer diameter of 30 µm to 100 µm, and are arranged such that a pitch, which is the distance between the axial lines of the second electrically connecting portions 34, is 90 µm to 350 µm. Herein, the pitch is 350 µm or less, for the same reason as the case in which the pitch of the first electrically connecting portions 33 is 350 µm or less. Herein, the outer diameter of the first electrically connecting portions 33 is larger than the outer diameter of the second electrically connecting portions 34, because a difference in thermal expansion between the mounting substrate 11 and the second substrate 13 is larger than a difference in thermal expansion between the first and the second substrates 12 and 13, and because the area of the mounting substrate 11 is larger than the area of the first substrate 12. More specifically, the first electrically connecting portions 33 are required to have reliability higher than that of the second electrically connecting portions 34. It should be noted that outer diameters and pitches of the second electrically connecting portions 34 may be uniform or different.

Each of the first electrically connecting portions 33 and each of the second electrically connecting portions 34 may form a pair one to one, and the first electrically connecting portion 33 and the second electrically connecting portion 34 forming a pair may be coaxially arranged. Each of the first electrically connecting portions 33 and each of the second electrically connecting portions 34 may be arranged at positions that are dislocated from each other.

In this manner, each of the first electrically connecting portions 33 is disposed closer to the outer peripheral portion than the first and the second bonding members 25 and 26. Each of the first electrically connecting portions 33 is made of a conductive material such as a metal material. Accordingly, with each of the first electrically connecting portions 33, the first and the second bonding members 25 and 26 can be shielded from electromagnetic waves that are present outside the fluidic device 1, and irradiation of electromagnetic waves from the outside of the fluidic device 1 onto the first and the second bonding members 25 and 26 can be suppressed. Thus, the influence of electromagnetic waves from the outside of the fluidic device 1 on a fluid flowing through the channel 2 can be suppressed. Furthermore, the first electrically connecting portions 33 are arranged in the shape of a ring so as to enclose the first and the second bonding members 25 and 26, and thus the shielding effect obtained with the first electrically connecting portions 33 can be improved.

Furthermore, the first and the second bonding members 25 and 26 for mechanically connecting the mounting substrate 11 and the second substrate 13 is disposed at the inner peripheral portion of the second substrate 13, and thus the first and the second bonding members 25 and 26 hardly receives an external force caused by a difference in the coefficient of thermal expansion between the mounting substrate 11 and the second substrate 13. Accordingly, reliability in bonding with the first and the second bonding members 25 and 26 can be improved, and troubles such as leakage of a fluid can be prevented.

Moreover, each of the second electrically connecting portions 34 is disposed closer to the outer peripheral portion than each of the third and the fourth bonding members 27 and 28. Each of the second electrically connecting portions 34 is made of a conductive material such as a metal material. Accordingly, with each of the second electrically connecting portions 34, each of the third and the fourth bonding members 27 and 28 can be shielded from electromagnetic waves that are present outside the fluidic device 1, and irradiation of electromagnetic waves from the outside of the fluidic device 1 onto each of the third and the fourth bonding members 27 and 28 can be suppressed. Thus, the influence of electromagnetic waves from the outside of the fluidic device 1 on a fluid flowing through the channel 2 can be suppressed. Furthermore, the second electrically connecting portions 34 are arranged in the shape of a ring so as to enclose the third and the fourth bonding members 27 and 28, and thus the shielding effect obtained with the second electrically connecting portions 34 can be improved.

Furthermore, each of the third and the fourth bonding members 27 and 28 for mechanically connecting the first and the second substrates 12 and 13 is disposed at the inner peripheral portion of the first and the second substrates 12 and 13, and thus each of the third and the fourth bonding members 27 and 28 hardly receives an external force caused by a difference in the coefficient of thermal expansion between the first and the second substrates 12 and 13. Accordingly, reliability in bonding with each of the third and the fourth bonding members 27 and 28 can be improved, and troubles such as leakage of a fluid can be prevented.

Each of the first, the second, the third and the fourth bonding members 25 to 28 may be made of either conductive materials or insulating materials. Each of the first, the second, the third and the fourth bonding members 25 to 28 is made of, for example, a metal material, a non-metal inorganic material, or a resin material. The first and the second bonding members 25 and 26, and the third and the fourth bonding members 27 and 28 may be made of the same material, or may be made of different materials. Furthermore, the first and the second bonding members 25 and 26 may be made of the same material, or may be made of different materials. Also, the third and the fourth bonding members 27 and 28 may be made of the same material, or may be made of different materials.

Examples of the metal material include iron/nickel-based alloys such as iron/nickel/cobalt alloys and iron/nickel alloys, oxygen-free copper, aluminum, stainless steel, copper/tungsten alloys, and copper/molybdenum alloys. The metal material is a conductive material.

Examples of the non-metal inorganic material include aluminum oxide-based sintered compacts and glass ceramic sintered compacts. Examples of the resin material include organic resin-based materials such as polytetrafluoroethylene (PTFE) and glass epoxy resins, and other resins. The resin material may be, for example, benzocyclobutene and liquid crystal polymers. The non-metal inorganic material and the resin material herein also refer to insulating materials having electric insulation.

Furthermore, as the method for bonding each of the first, the second, the third and the fourth bonding members 25 to 28 to the mounting substrate 11, the first substrate 12 and the second substrate 13, it is possible to use methods for bonding with bonding agents such as tin/silver-based and other solders, gold/tin waxes and other low-melting waxes, silver/germanium-based and other high-melting waxes, and conductive organic resins, and welding methods such as seam welding and electron beam welding.

In a case where each of the first, the second, the third and the fourth bonding members 25 to 28 is made of the metal material, then the bond strength obtained with each of the first, the second, the third and the fourth bonding members 25 to 28 can be improved. Furthermore, the channel portions 15 to 19 can be connected in a state where the internal connecting channels 25a to 28a are sealed well. Moreover, bonding can be obtained with a simple treatment operation at low temperature. Furthermore, bonding can be performed in a successive manner by, for example, a reflow process. The mounting substrate 11, the first substrate 12 and the second substrate 13 also can be electrically connected via the first, the second, the third and the fourth bonding members 25 to 28.

In a case where each of the first, the second, the third and the fourth bonding members 25 to 28 is made of the insulating material, then the thermal resistance and the chemical resistance of each of the first, the second, the third and the fourth bonding members 25 to 28 can be improved. In particular, when a fluorine-based resin such as polytetrafluoroethylene (PTFE), which is a resin material, is used as the insulating material, high thermal resistance and high chemical resistance can be obtained at the same time. In addition to the above, an acrylic resin, an epoxy resin, polyimide, and the like also can provide high thermal resistance and high chemical resistance at the same time. Furthermore, in a case where each of the first, the second, the third and the fourth bonding members 25 to 28 is made of high purity glass such as quartz glass, high silica glass, crystalline glass, or the like then high chemical resistance can be obtained.

Furthermore, in a case where each of the first, the second, the third and the fourth bonding members 25 to 28 is made of the insulating material, internal wiring may be provided. When internal wiring is provided in this manner, the thermal resistance and the chemical resistance of each of the first, the second, the third and the fourth bonding members 25 to 28 can be improved, and electrical connection via each of the first, the second, the third and the fourth bonding members 25 to 28 can be obtained.

The internal wiring provided at the first and the second bonding members 25 and 26 functions as a first electrically connecting portion, and the internal wiring provided at each of the third and the fourth bonding members 27 and 28 functions as a second electrically connecting portion. In a case where internal wiring is provided at each of the first, the second, the third and the fourth bonding members 25 to 28, the internal wiring may be provided in addition to the first and the second electrically connecting portions 33 and 34 described above, or may be provided instead of the first and the second electrically connecting portions 33 and 34 described above.

The first and the second bonding members 25 and 26, and the third and the fourth bonding members 27 and 28 may be made of different materials, for example, one may be made of the metal material, and the other may be made of the insulating material. When the first bonding portion and the second bonding portion are made of different materials in this manner, the treatment temperature at the time of bonding can be made different between the first bonding portion and the second bonding portion. For example, setting the treatment temperature for bonding with the second bonding portion higher than the treatment temperature of the first bonding portion, the first and the second substrates 12 and 13 can be bonded to form the first constituent member 3 having the internal channel, and then the mounting substrate 11 and the second substrate 13 can be bonded to bond the first and the second constituent members 3 and 4.

In a case where the treatment temperature for bonding with the second bonding portion is set to be higher than the treatment temperature for bonding with the first bonding portion in this manner, it is possible to apply a combination in which the first and the second bonding members 25 and 26 is made of tin/lead-based solder, and each of the third and the fourth bonding members 27 and 28 is made of fritted glass having a bonding temperature point higher than that of the tin/lead-based solder, or a combination in which the first and the second bonding members 25 and 26 is made of an epoxy resin, and each of the third and the fourth bonding members 27 and 28 is made of tin/silver/copper-based solder having a melting point higher than that of the epoxy resin.

Furthermore, the inner peripheral portion, of the first and the second bonding members 25 and 26, serving as a surface portion that is brought into contact with a fluid may be made of a cylindrical corrosion-resistant member 37 having corrosion resistance. The inner peripheral portion, of each of the third and the fourth bonding members 27 and 28, serving as a surface portion that is brought into contact with a fluid may be made of a cylindrical corrosion-resistant member 38 having corrosion resistance. Each of the corrosion-resistant members 37 and 38 is a member that has acid resistance, chemical resistance and the like, that has resistance against a fluid, and that is not eroded by the fluid. Each of the corrosion-resistant members 37 and 38 is made of, for example, polytetrafluoroethylene (PTFE). When each of the corrosion-resistant members 37 and 38 is used in this manner, the acid resistance and the chemical resistance of the first, the second, the third and the fourth bonding members 25 to 28 against a fluid can be improved, and thus the corrosion resistance can be improved.

Figure 5:
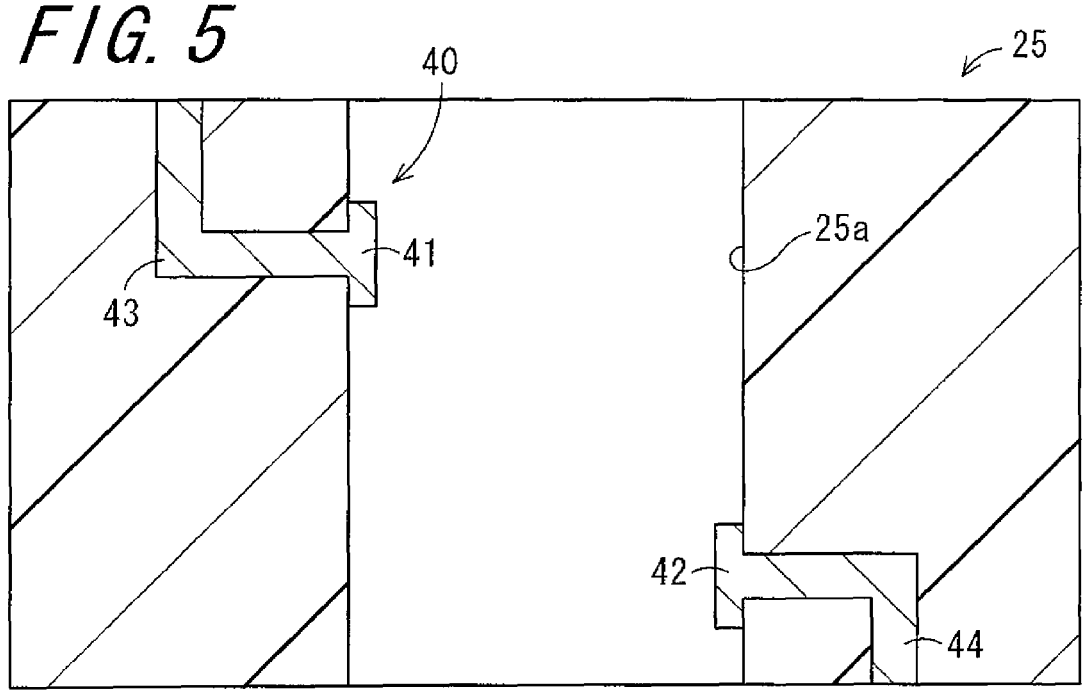
FIG. 5 is an enlarged cross-sectional view showing the first bonding member.

FIG. 5 is an enlarged cross-sectional view showing the first bonding member 25. At least any one of the first, the second, the third and the fourth bonding members 25 to 28 may be provided with a driving portion 40 for driving a fluid in the connecting channel inside the bonding member to flow. The driving portion 40 may be provided at only one, two, three, or all of four, of the first, the second, the third and the fourth bonding members 25 to 28. The bonding member that is provided with the driving portion 40 may be selected as appropriate. FIG. 5 shows the configuration in a case where the first bonding member 25 is provided with the driving portion 40.

The driving portion 40 is realized as an electroosmotic flow pump. The electroosmotic flow pump has a pair of electrodes 41 and 42 that are provided to be exposed on the inner wall face of the connecting channel 25a. The electrodes 41 and 42 are arranged spaced away from each other on the connecting channel 25a. The electrodes 41 and 42 are electrically connected, via internal wiring 43 and 44, to the wiring conductor of either one of the mounting substrate 11 and the second substrate 13.

When driving voltage is applied between the electrodes 41 and 42, the electroosmotic flow pump charges a liquid inside the connecting channel 25a, with surface potential on the inner wall face of the first bonding member 25. When an electric field is applied to the liquid in this manner, the liquid can be driven. In a case where this electroosmotic flow pump is provided as the driving portion 40, a fluid can be efficiently driven to flow, by forming the inner wall face of the first bonding member 25 using a material that has a large surface area, such as a porous material (porous member).

When the first and the second bonding members 25 and 26 are provided with the driving portion 40, a fluid can be given a driving force to flow at a position close to the first channel 6. Furthermore, when the third and the fourth bonding members 27 and 28 are provided with the driving portion 40, a fluid can be given a driving force to flow at the first channel 6. In a case where the first, the second, the third and the fourth bonding members 25 to 28 are provided with the driving portion 40, it is not necessary to additionally provide fluid supplying means for supplying a fluid.

When the electroosmotic flow pump is used as the driving portion 40, means for causing a fluid to flow can be installed without making the fluidic device 1 large, which contributes to downsizing.

In the foregoing description, the mounting substrate 11 and the second substrate 13 are bonded to each other with the first and the second bonding members 25 and 26, and the first and the second substrates 12 and 13 are bonded to each other with the third and the fourth bonding members 27 and 28. However, for example, in a case where there is no difference in the coefficient of thermal expansion between the mounting substrate 11 and the second substrate 13, the mounting substrate 11 and the second substrate 13 may be directly bonded to each other, without the first and the second bonding members 25 and 26, such that the opening portion 6a is opposed to the opening portion 7a, and such that the opening portion 6b is opposed to the opening portion 7b. Similarly, for example, in a case where there is no difference in the coefficient of thermal expansion between the first and the second substrates 12 and 13, the first and the second substrates 12 and 13 may be directly bonded to each other, without the third and the fourth bonding members 27 and 28, such that the opening portion 17a is opposed to the opening portion 19a, and such that the opening portion 18a is opposed to the opening portion 19b.

Figure 6:
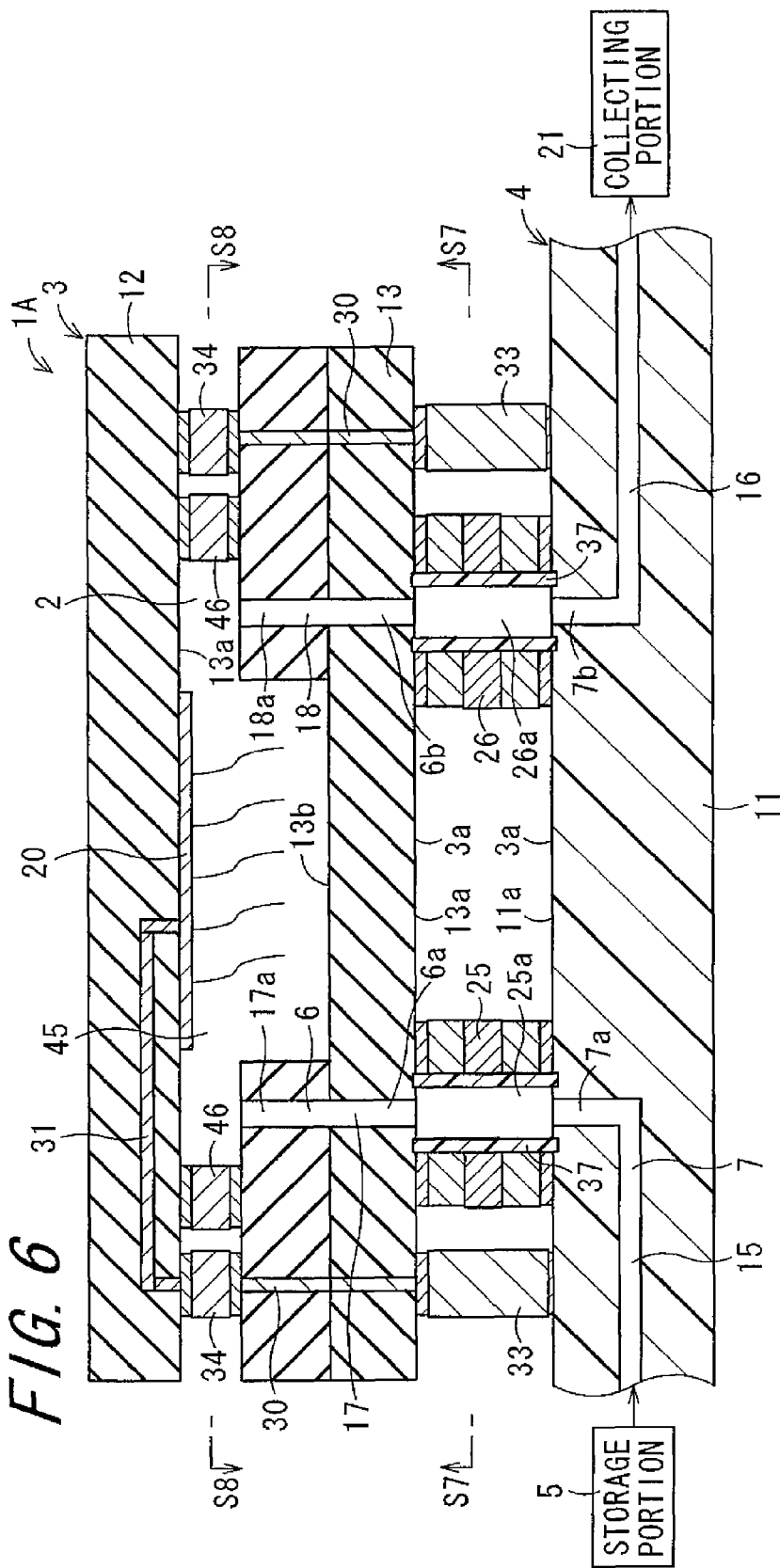
FIG. 6 is a cross-sectional view showing a fluidic device according to another embodiment of the invention.
Figure 7:
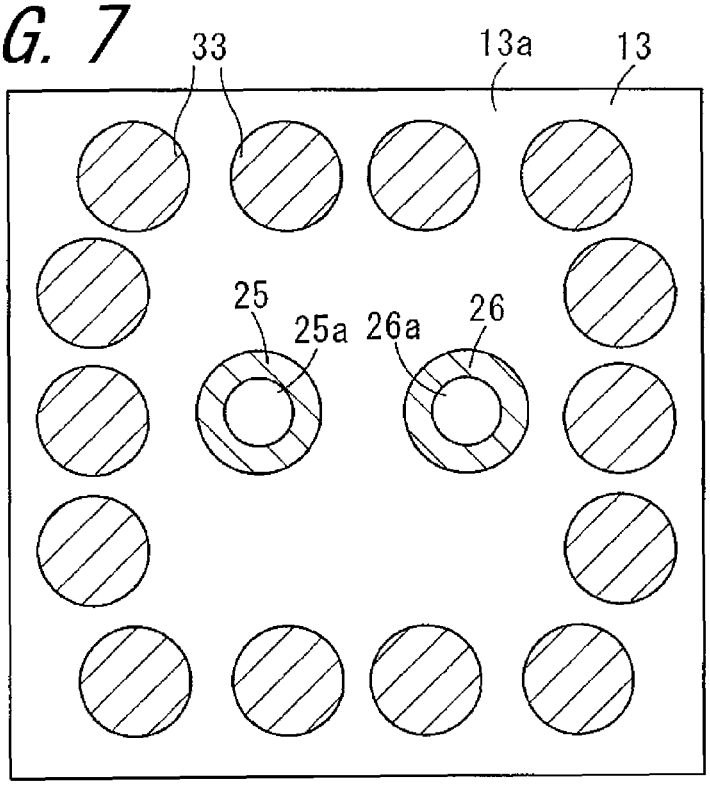
FIG. 7 is a simplified cross-sectional view showing the structure connecting the mounting substrate and the second substrate, viewed from a cutting plane line S7-S7 in FIG. 6.
Figure 8:
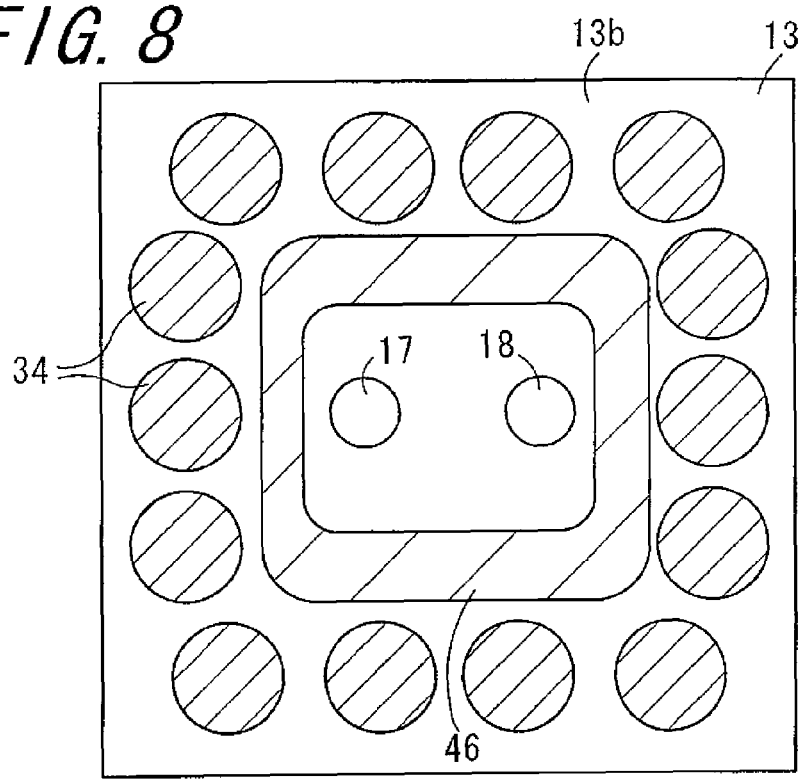
FIG. 8 is a simplified cross-sectional view showing the structure connecting the first and the second substrates, viewed from a cutting plane line S8-S8 in FIG. 6.

FIG. 6 is a cross-sectional view showing a fluidic device 1A according to another embodiment of the invention. FIG. 7 is a simplified cross-sectional view showing the structure connecting the mounting substrate 11 and the second substrate 13, viewed from a cutting plane line S7-S7 in FIG. 6. FIG. 8 is a simplified cross-sectional view showing the structure connecting the first and the second substrates 12 and 13, viewed from a cutting plane line S8-S8 in FIG. 6. The fluidic device 1A shown in FIGS. 6 to 8 is similar to the fluidic device 1 shown in FIGS. 1 to 5, and thus corresponding components are denoted by the same reference numerals, and only different configurations are described.

In the fluidic device 1A in FIGS. 6 to 8, the first substrate 12 does not have the first inside channel portion 19, and the first channel 6 has the second inside channel portions 17 and 18 that are formed inside the second substrate 13, and a channel-portion-between-substrates 45 that is constituted by a gap between the first and the second substrates 12 and 13 including a recess portion provided in the second substrate 13, and is configured by connecting the second inside channel portions 17 and 18 and the channel-portion-between-substrates 45. In the fluidic device 1A, a third bonding member 46 is formed, for example, in the shape of a substantially rectangular endless ring in plan view. When the third bonding member 46 is used to bond the first and the second substrates 12 and 13, the internal space enclosed by the third bonding member 46 between the first and the second substrates 12 and 13 is defined as the channel-portion-between-substrates 45.

The third bonding member 46 is disposed on the other main face 13b of the second substrate 13 so as to enclose the first discharge opening portion 17a and the second introduction opening portion 18a. Thus, the first discharge opening portion 17a and the second introduction opening portion 18a are connected to the channel-portion-between-substrates 45. The MEMS 20 is disposed on the one main face 12a of the first substrate 12 so as to be exposed on the channel-portion-between-substrates 45.

Except for the effect obtained by providing the first inside channel portion 19, the fluidic device 1A also can achieve excellent effects as in FIGS. 1 to 5 described above. Furthermore, according to the fluidic device 1A, the first channel 6 is formed using a gap between the first and the second substrates 12 and 13, and thus the first channel 6 can be formed easily. Furthermore, the MEMS 20 may be formed not inside the first substrate 12 but on the main face, and thus the MEMS 20 can be provided easily. Accordingly, the fluidic device 1A can be formed easily.

Furthermore, in the fluidic device 1A, the third bonding member 46 is disposed closer to the outer peripheral portion than the first and the second bonding members 25 and 26. The first and the second bonding members 25 and 26 internally having the connecting channels 25a and 26a is disposed closer to the inner peripheral portion than the third bonding member 46, and thus the first and the second bonding members 25 and 26 hardly receives an external force caused by a difference in the coefficient of thermal expansion between the mounting substrate 11 and the second substrate 13. Accordingly, reliability in bonding with the first and the second bonding members 25 and 26 can be improved, and troubles such as leakage of a fluid can be prevented. Furthermore, the third bonding member 46 is disposed closer to the outer peripheral portion than the first and the second bonding members 25 and 26, and thus the volume of the channel-portion-between-substrates 45 can be increased, so that the area for reacting the MEMS 20 and a fluid can be increased.

Furthermore, as a fluidic device according to another embodiment of the invention, the first and the second bonding members 25 and 26 and the first electrically connecting portions 33 in each of the fluidic devices 1 and 1A in FIGS. 1 to 8 may be integrated. The first and the second bonding members 25 and 26 and the first electrically connecting portions 33 may be integrated in any combination of one to one, one to plural, or plural to one. For example, a configuration may be applied in which the first bonding portion is formed as one member in the shape of an endless ring made of an insulating material, and the first bonding member is provided with a plurality of internal wiring lines as the first electrically connecting portions 33.

In a case where the first bonding portion for mechanically connecting the mounting substrate 11 and the second substrate 13, and the first electrically connecting portions 33 for electrically connecting the mounting substrate 11 and the second substrate 13 are integrated in this manner, the number of components can be reduced, and mechanical connection and electrical connection between the mounting substrate 11 and the second substrate 13 can be obtained at the same time. In this manner, the configuration of the fluidic device can be simplified, and the number of steps in the connecting operation can be reduced, so that the fluidic device can be produced easily. Furthermore, when the first electrically connecting portions 33 and the first bonding portion are integrated, the first bonding portion can be shielded, with the first electrically connecting portions 33, from electromagnetic waves that are present outside the fluidic device. Thus, the influence of electromagnetic waves from the outside of the fluidic device on a fluid flowing through the channel can be suppressed.

Furthermore, the second bonding members 27 and 28 and the second electrically connecting portions 34 in the fluidic device 1 in FIGS. 1 to 5 may be integrated. The third and fourth bonding members 27 and 28 and the second electrically connecting portions 34 may be integrated in any combination of one to one, one to plural, or plural to one. Furthermore, the third bonding member 46 and the second electrically connecting portions 34 in the fluidic device 1A in FIGS. 6 to 8 may be integrated. The third bonding member 46 may be integrated with one second electrically connecting portion 34, or may be integrated with a plurality of second electrically connecting portions 34. The third bonding member 46 may be integrated with all of the second electrically connecting portions 34.

In a case where the second bonding portion for mechanically connecting the first and the second substrates 12 and 13, and the second electrically connecting portions 34 for electrically connecting the first and the second substrates 12 and 13 are integrated in this manner, the number of components can be reduced, and mechanical connection and electrical connection between the first and the second substrates 12 and 13 can be obtained at the same time. In this manner, the configuration of the fluidic device can be simplified, and the number of steps in the connecting operation can be reduced, so that the fluidic device can be produced easily. Furthermore, when the second electrically connecting portions 34 and the second bonding portion are integrated, the second bonding portion can be shielded, with the second electrically connecting portions 34, from electromagnetic waves that are present outside the fluidic device. Thus, the influence of electromagnetic waves from the outside of the fluidic device on a fluid flowing through the channel can be suppressed.

In the foregoing description, the mounting substrate 11 and the second substrate 13 are bonded to each other with the first and the second bonding members 25 and 26, and the first and the second substrates 12 and 13 are bonded to each other with the third bonding member 46. However, for example, in a case where there is no difference in the coefficient of thermal expansion between the mounting substrate 11 and the second substrate 13, the mounting substrate 11 and the second substrate 13 may be directly bonded to each other, without the first and the second bonding members 25 and 26, such that the opening portion 6a is opposed to the opening portion 7a, and such that the opening portion 6b is opposed to the opening portion 7b. Furthermore, for example, in a case where there is no difference in the coefficient of thermal expansion between the first and the second substrates 12 and 13, the first and the second substrates 12 and 13 may be directly bonded to each other, without the third bonding member 46. It should be noted that in a case where the first and the second substrates 12 and 13 are directly bonded to each other, a recess portion is formed on at least one of mutually opposing surfaces of the first and the second substrates 12 and 13, and a channel-portion-between-substrates that is constituted by the recess portion is connected to the opening portions 17a and 18a of the second substrate 13.

Regarding the channel-portion-between-substrates 45 that is formed between the first and the second substrates 12 and 13, in a case where the first and the second substrates 12 and 13 are directly bonded to each other without the third bonding member 46, a configuration also may be applied in which a recess is formed on at least one of the first and the second substrates 12 and 13, and this recess serves as the channel-portion-between-substrates 45. Furthermore, in the foregoing example described with reference to FIGS. 6 to 8, in a configuration in which the first and the second substrates 12 and 13 are bonded to each other with the third bonding member 46, the channel-portion-between-substrates 45 is constituted also by the recess that is formed on at least one of the first and the second substrates 12 and 13. However, in a case where the first and the second substrates 12 and 13 are bonded to each other with the third bonding member 46, a configuration also may be applied in which no recess is formed on the first and the second substrates 12 and 13, and in a gap between the first and the second substrates 12 and 13 that is defined by the third bonding member 46, an inner area of the third bonding member 46 is used to constitute the channel-portion-between-substrates 45. In this manner, there is no limitation on the configuration of the channel-portion-between-substrates 45, as long as a gap is formed between the first and the second substrates 12 and 13, and the channel-portion-between-substrates 45 is realized as the gap.

Figure 9:
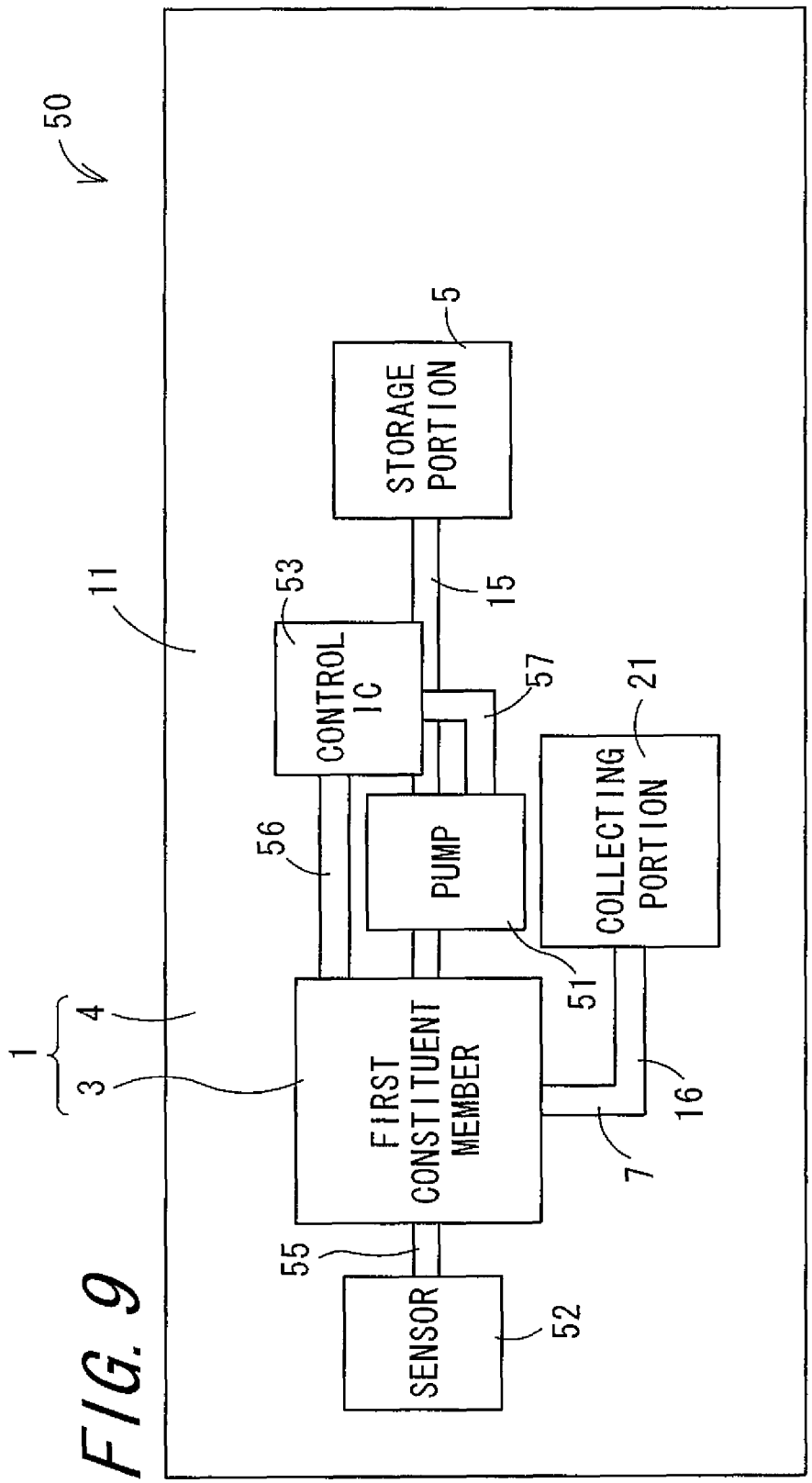
FIG. 9 is a simplified block diagram showing a fluidic device according to another embodiment of the invention.

FIG. 9 is a simplified block diagram showing a fluidic device 50 according to another embodiment of the invention. FIG. 9 shows the fluidic device 50 in plan view, and each component as a block. In the fluidic device 1, treatment relating to a liquid is performed in the first channel 6.

The fluidic device 50 is provided with a pump 51 as fluid supplying means for supplying a fluid to the first channel 6 of the fluidic device 1. The pump 51 is provided on the second channel 7, for example, such that the pump 51 is mounted on the mounting substrate 11 so as to be disposed midway through the supplying channel portion 15. The pump 51 is used for supplying the fluid. In particular, a demand for a small pump 51 raises a desire for an electrophoretic pump, for example. And a demand for a high flow rate raises a desire for a piezo-driven pump, for example. The piezo-driven pump has an electrode inside the pump. It is desired that a material of surface of the electrode be gold, platinum, or the like material, from a perspective of the corrosion resistance. A site where the electrode is formed, is preferably made of a resin material such as glass epoxy material, various kinds of glass, or laminated ceramic materials, on which the electrode can be formed using the metallizing method. Through such a pump 51, the liquid inside the storage portion 5 can flow into the first constituent member 3. The fluid plays a desired role inside the first constituent member 3 and thereafter collected by the collecting portion 21. Regarding the pump 51, in a case where the driving portion 40 has been installed in one of the first bonding portion and the second bonding portion as shown in FIG. 5, this driving portion 40 can be used as the pump 51.

Furthermore, the fluidic device 50 has a sensor 52 as detecting means for detecting quantity of state relating to a fluid inside the first channel 6 in the fluidic device 1. The sensor 52 is mounted on the mounting substrate 11. The sensor 52 detects quantity of state representing at least one of a physical condition and a chemical condition of a fluid, such as pH, temperature, constituents, and pressure. A sensor 52 may detect temperature, humidity, and the like, and may numerically output an environmental change such as an external temperature outside the system. The environmental change is fed back to an electric operation of the first constituent member 3 or an operation of the fluid inside the first constituent member 3. For example, in a case of operating a task such as PCR (polymerase chain reaction) amplification of DNA chip inside an element, a flow rate is adjusted depending on a change of external temperature. In this case, the sensor 52 is a temperature sensor.

Furthermore, the fluidic device 50 is provided with a control IC 53 as control means for controlling the pump based on the quantity of state detected by the sensor 52. The control IC 53 is mounted on the mounting substrate 11. The pump 51, the sensor 52, and the control IC 53 are electrically connected to each other via connection wires 55 to 57 made of a part of the wiring conductor formed on the one main face 11a of the mounting substrate 11.

For example, the control IC 53 calculates the flow rate of a fluid that is to flow through the first channel 6 based on the quantity of state detected by the sensor 52, and controls the pump 51 such that the fluid flows in this flow rate. In this manner, the control IC 53 controls, for example, the flow rate of a fluid that flows through the first channel 6. The configuration of the control IC 53 is not limited to that for controlling the flow rate. The configuration of the control IC 53 is for controlling the quantity of state of a fluid that flows through the first channel 6, by controlling the pump 51 in response to the results detected by the sensor 52, and it is possible to apply a configuration, for example, for controlling the pressure of a fluid that flows through the first channel 6.

In this manner, it is possible to realize the preferable fluidic device 50 that is small and efficient. For example, the fluidic device 50 may be an apparatus for analyzing, examining, and measuring a fluid thereby acquiring information of the fluid, may be an apparatus for performing an artificial treatment operation such as chemical treatment on a fluid, or may be an apparatus for performing a treatment operation on another apparatus, for example, cooling the other apparatus utilizing a fluid.

The fluidic device 50 can be used as, for example, a sensing device for acquiring information of a fluid. In this case, with respect to the fluidic device 50, the MEMS 20 serving as a sensor element provided inside the first channel 6 acquires information relating to a fluid inside the first channel 6. The information acquired by the MEMS 20 may be chemical information such as information of constituents or properties, may be physical information such as mass or density, or may be a combination thereof, for example. As an example of this sensing module, the fluidic device 50 can be used as a biosensor. In a case where the fluidic device 50 is used as a biosensor, for example, a liquid containing biomedical tissues is used as a fluid, and the constituents of the liquid are analyzed with the MEMS 20. In this case, the sensor 52 detects pH, temperature, and the like of the liquid, and the control IC 53 controls the pump 51 such that the pH, temperature, and the like is suitable for analyzing the constituents of the liquid.

In this manner, the apparatus for analyzing, examining, and measuring a fluid thereby acquiring information of the fluid can be preferably realized.

Furthermore, the fluidic device 50 can be used as, for example, a fluid treating device for treating a fluid. In this case, with respect to the fluidic device 50, the MEMS 20 serving as a fluid treating element provided inside the first channel 6 treats a fluid inside the first channel 6. The treatment performed by the MEMS 20 may be chemical treatment such as causing reaction between constituents of the fluid, may be physical treatment such as agitation, heating, or photoirradiation, or may be a combination thereof. As an example of this fluid module, the fluidic device 50 can be used as a micro reactor. In a case where the fluidic device 50 is used as a micro reactor, for example, a fluid in which two or more types of liquids serving as raw materials are mixed is used as a fluid, the raw materials are chemically reacted by performing treatment with the MEMS 20, and thus a new material is produced. In this case, the sensor 52 detects temperature, constituents, and the like of the liquid, and the control IC 53 controls the pump 51 so as to obtain suitable temperature, constituents, and the like. In this manner, the apparatus for performing an artificial treatment operation such as chemical treatment on a fluid can be preferably realized.

Next, more specific configuration and operation of the fluidic device 50 shown in FIG. 9 will be described.

Figure 10A:
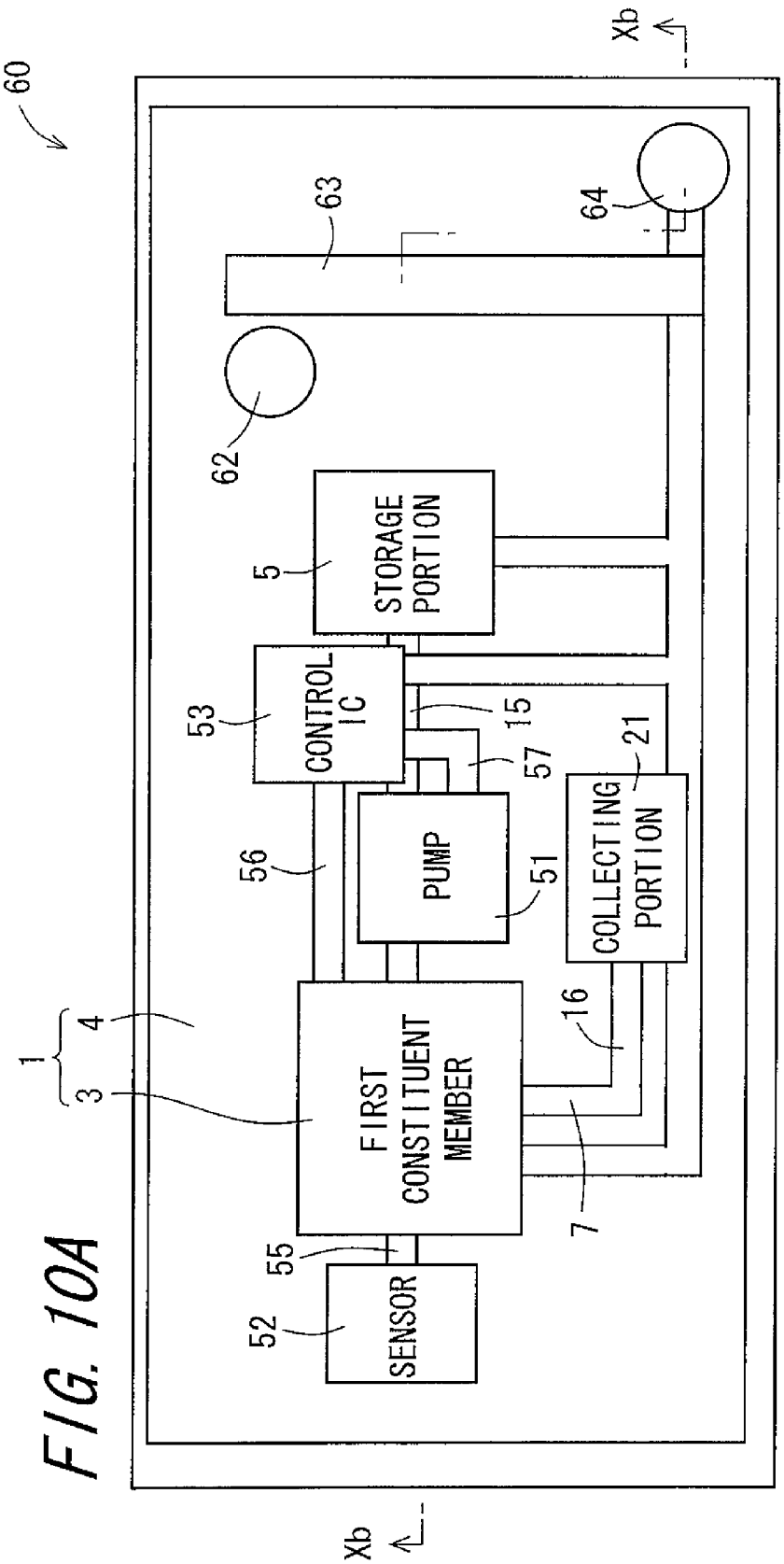
FIG. 10A is a plan view showing a DNA detector.

FIGS. 10A and 10B show an example of the configuration in the case where the fluidic device 50 shown in FIG. 9 is used as a DNA detector for detecting a predetermined DNA component in a blood. Herein, FIG. 10A is a plan view of the DNA detector 60, and FIG. 10B is a cross-sectional view showing the DNA detector 60, viewed from a cutting plane line Xb-Xb in FIG. 10A.

The DNA detector 60 is configured such that for detection of a first DNA component, a second DNA component which forms a counterpart of the first DNA component is attached to the MEMS 20 in advancer and in a case where the first DNA component contained in the blood flowing through the channel 2 is coupled to the second DNA component, that is, hybridization reaction is caused, the current flows in the MEMS 20.

With respect to such a DNA detector 60, a microneedle 61 is attached to the storage portion 5. By projecting this microneedle 61 according to need and collecting a blood of human or animal, flowing the blood through the channel 2 while or after storing the blood in the storage portion 5, a particular component in the blood or the like can be detected.

In addition, an input button 62 is a button for electrical activation of the DNA detector 60. By pressing the input button 62, the respective components of the DNA detector 60 are electrically connected to each other.

Further, a displaying portion 63 can display a result of detection by the MEMS 20. For example, as a result of hybridization reaction of the first DNA component in the blood with the second DNA component in the blood which is attached to the MEMS 20 in advance, the electric current value flowing in the MEMS 20 can be displayed.

Furthermore, a battery 64 is, for example, a button cell. When the input button 62 is pressed, electricity is supplied from this battery 64 to the respective components.

Note that, in order to facilitate the understanding of the constitution of the DNA detector 60, in FIG. 10B, the input button 62, the battery 64 and wiring indicating electric connection of the respective components thereto, are illustrated.

The storage portion 5 and the collecting portion 21 each have a box shape made of metal or resin with a profile size of around 5 mm to 30 mm. A preferable example of the metal material is metal such as SUS-based material which has high corrosion resistance to, especially, a liquid. In addition, taking account of reliability for mounting, it is preferable to use a material such as Fe—Ni—Co-based alloy which has a relatively small coefficient of thermal expansion. Likewise, in selecting a resin material, a material having high corrosion resistance is preferred. Highly-corrosion-resistant material such as Teflon-based resin and epoxy resin are desired.

The pump 51, the storage portion 5, and the collecting portion 21 are connected to a mounting substrate such as a PCB substrate so that the liquid will not leak out. Between the mounting substrate and respective members such as the pump 51 are provided hollow metal or resin-made ring.

The ring allows such connection between the respective members and the mounting substrate that no liquid leaks out. Concerning the mounting of the ring, a solder material may be used, for example, to mount the ring on the PCB substrate and in particular, the use of the solder material is preferable in the case where the airtightness is highly required. In the case where the corrosion resistance is highly required, the ring is desirably made of a highly-corrosion-resistant material such as epoxy resin.

Note that, as shown in FIG. 10B, the mounting substrate 11 and a part of components mounted on the mounting substrate 11 may be housed in a case 65, and the input button 62, the displaying portion 63 and the battery 64 may be provided on an outer surface of the case 65 so as to be exposed to outside. In addition, the needle 61 may be configured so as to project from the case 65 according to need.

The constitution described above allows facilitated handling of the liquid without contact with outside, thereby resulting in a small and inexpensive fluidic device.

Figure 11A:
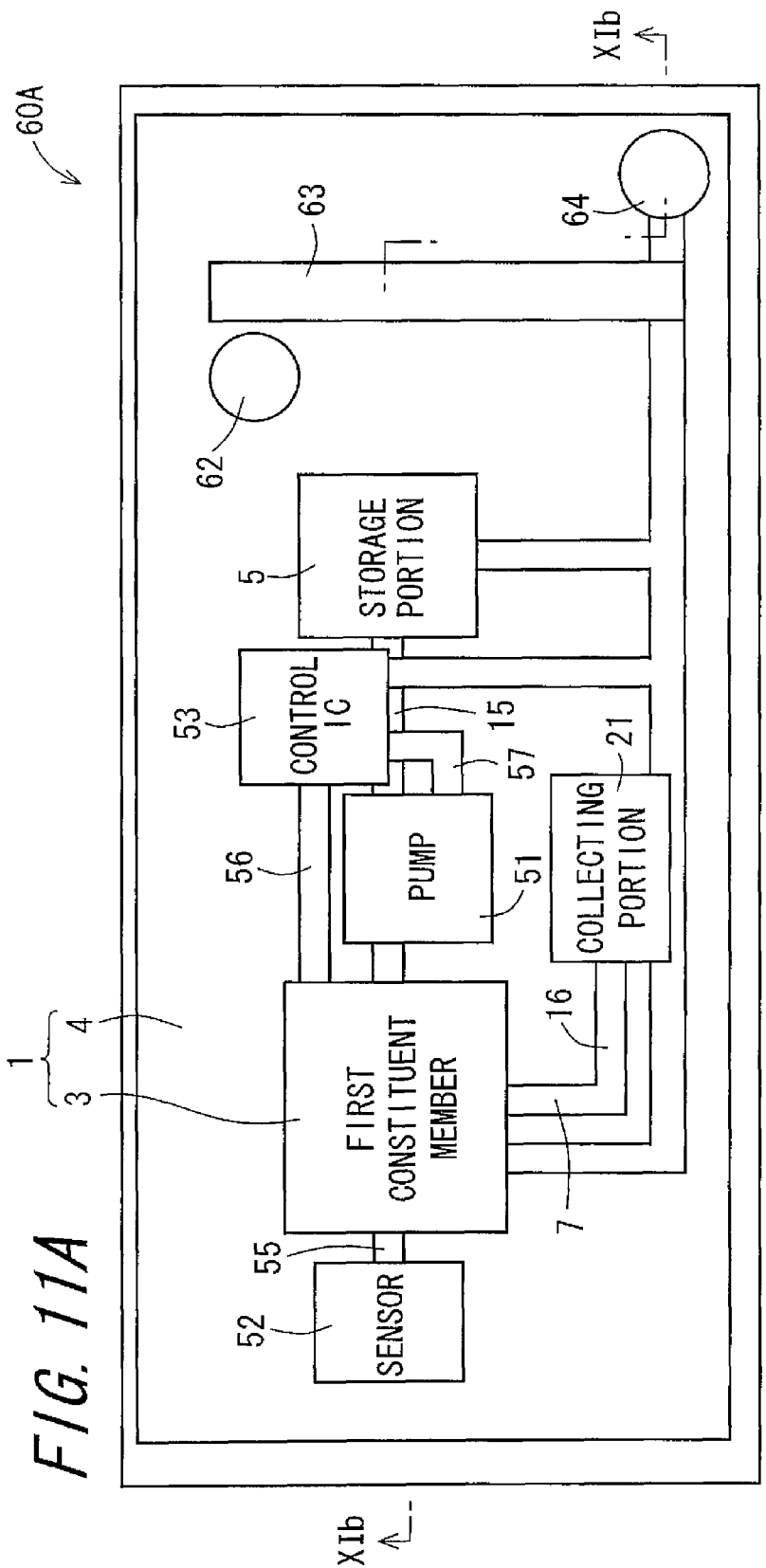
FIG. 11A is a plan view showing an air pollution sensor.
Figure 11B:
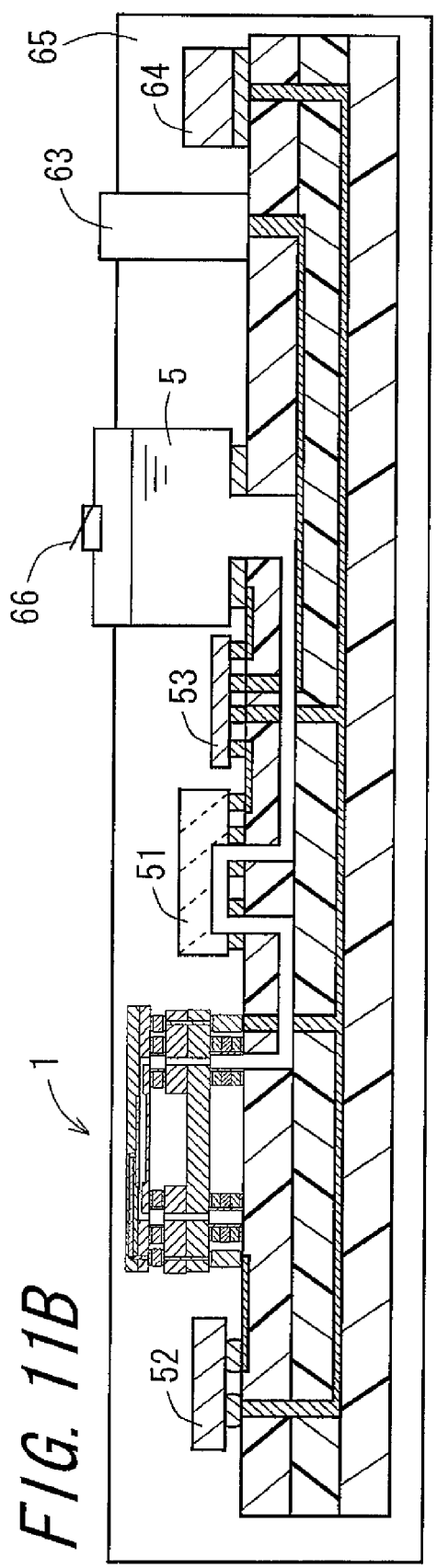
FIG. 11B is a cross-sectional view showing the air pollution sensor.

FIGS. 11A and 11B show an example of the configuration in the case where the fluidic device 50 shown in FIG. 9 is used as an air pollution sensor 60A. Herein, FIG. 11A is a plan view of the air pollution sensor 60A, and FIG. 11B is a cross-sectional view of the air pollution sensor 60A, viewed from a cutting plane line XIb-XIb in FIG. 11A.

In the air pollution sensor 60A, as shown in FIGS. 11A and 11B, the storage portion 5 is provided with a lid 66. When the input button 62 is pressed, this lid 66 is open. By filling the storage portion 5 with a liquid in which a predetermined gas component dissolves, the inspection of an amount of the predetermined gas component dissolving in this liquid can lead to the detection of an amount of the gas component of the atmosphere. Since the other components are the same as those of FIGS. 10A and 10B, descriptions thereof is omitted.

Figure 12:
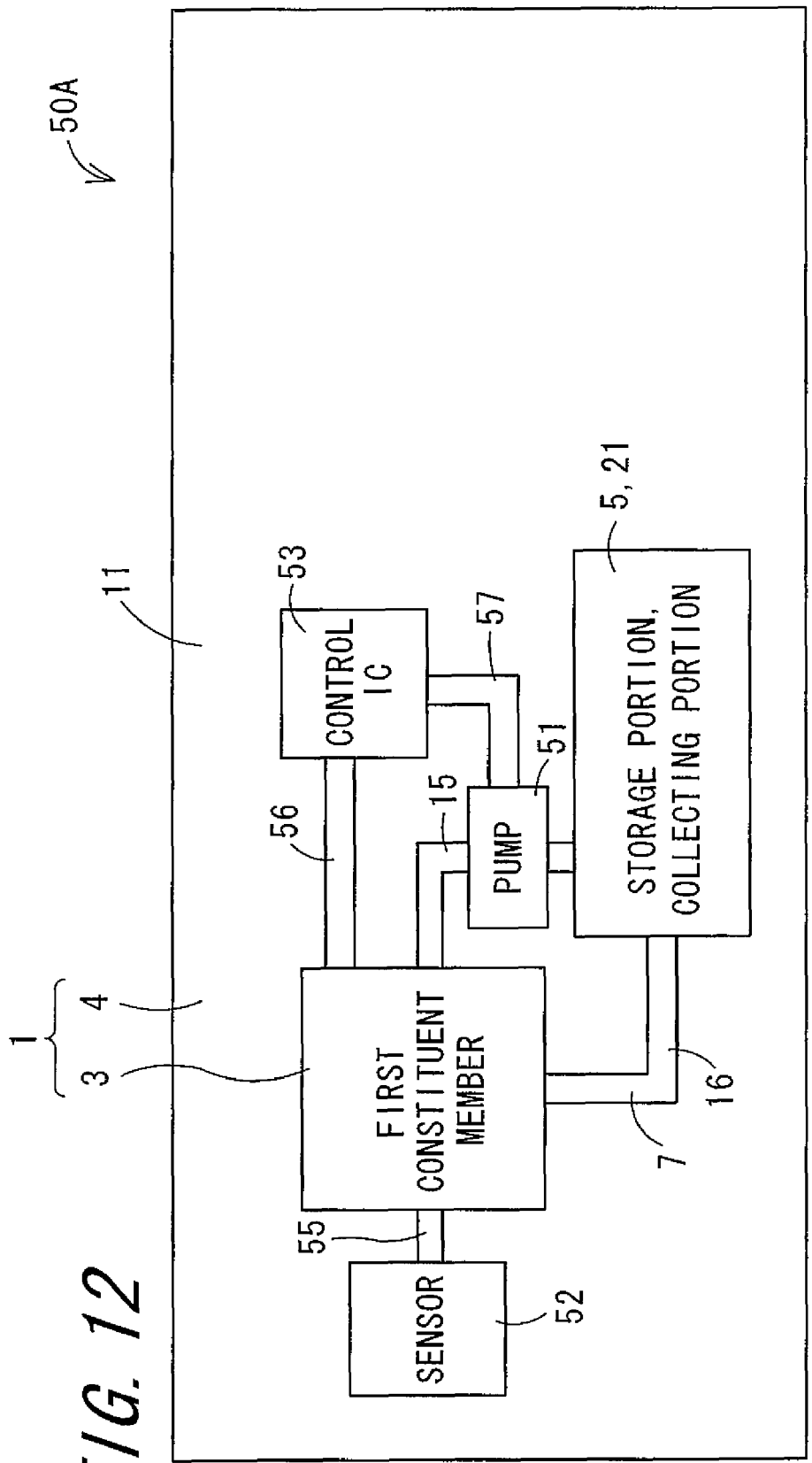
FIG. 12 is a simplified block diagram showing a fluidic device according to still another embodiment of the invention.

FIG. 12 is a simplified block diagram showing a fluidic device 50A according to still another embodiment of the invention. FIG. 12 shows the fluidic device 50A in plan view, and each component as a block. The fluidic device 50A is similar to the fluidic device 50 in FIG. 9, and thus corresponding components are denoted by the same reference numerals, and only different configurations are described. In the fluidic device 50 in FIG. 9, the collecting portion 21 is provided in addition to the storage portion 5. However, in the fluidic device 50A in FIG. 12, the storage portion 5 also serves as the collecting portion 21. Even with this configuration, as in the case of the fluidic device 50 in FIG. 9, for example, this apparatus can be used as an apparatus for analyzing, examining, and measuring a fluid thereby acquiring information of the fluid, as an apparatus for performing an artificial treatment operation such as chemical treatment on a fluid, or as an apparatus for performing a treatment operation on another apparatus, for example, cooling the other apparatus utilizing a fluid, and the preferable apparatus can be realized.

The fluidic device 50A shown in FIG. 12 can be used as, for example, a cooling device for cooling a target utilizing a fluid. In this case, the MEMS 20 may not be provided. The target may be a semiconductor device that generates heat. This target is provided within the first channel 6 or close to the first channel 6. For example, the target may be provided in contact with the first substrate 12 or may be included within the first substrate 12. In a case where the fluid apparatus 50A is used as a cooling module, for example, a liquid serving as a refrigerant is used as a fluid, the liquid is cooled by providing the storage portion 5 with cooling means for cooling the liquid, and the liquid is circulated through the first and the second channels 6 and 7. As the cooling means, for example, cooling elements such as a heat sink and a Peltier element can be used. In this case, the sensor 52 detects, for example, temperature of the liquid serving as a refrigerant, and the control IC 53 controls the pump 51 so as to obtain suitable temperature at a position for cooling the target. In this manner, the apparatus for cooling another apparatus utilizing a fluid can be preferably realized.

The invention is not limited to the foregoing embodiments, and various modification can be made within the gist of the invention. For example, in the foregoing embodiments, three substrates, that is, the mounting substrate 11, the first substrate 12 and second substrate 13, are provided, but two substrates, or four or more substrates may be provided. Furthermore, the first channel 6 may be provided with a plurality of MEMSs 20.

Further, in the case where the first constituent member can be mounted on the mounting substrate and the first channel inside the first constituent member and the second channel inside the mounting substrate can be connected, the configuration of the first constituent member, and positions and number of opening portions are not limited to those mentioned above, and the shape, arrangement and number of substrates applied, and, if any bonding member are applied, the presence or absence, shape and material of the bonding member are not limited to those mentioned above, and various modifications thereof are possible.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A fluidic device, comprising:
    a first constituent member internally having a first channel; and
    a mounting substrate internally having a second channel, the first constituent member being mounted on the mounting substrate,
    a first bonding portion for bonding the first constituent member and the mounting substrate to each other, the mounting substrate having a supplying portion for storing a fluid which is supplied to the first channel and a collecting portion for storing a fluid which is discharged from the first channel,
    the second channel having a first part channel connected to the supplying portion and a second part channel connected to the collecting portion,
    wherein the first part channel and the second part channel are connected to each other via the first channel, and
    wherein the first bonding portion has a first bonding member and a second bonding member, the first bonding member internally having a channel for connecting the first channel and the first part channel to each other, and the second bonding member internally having a channel for connecting the first channel and the second part channel to each other.

2. The fluidic device of claim 1, wherein the supplying portion and the collecting portion are integrated together into a single portion, wherein the single portion supplies a fluid to the first channel and collects a fluid from the first channel.

3. The fluidic device of claim 1, further comprising a pump to flow a fluid.

4. The fluidic device of claim 3, further comprising a sensor to detect a quantity of state relating to a fluid in the first channel, and a controller to control a drive of the pump based on the quantity of state detected by the sensor.

5. The fluidic device of claim 3, further comprising a detector to detect a state of the fluid or a predetermined component in the fluid.

6. The fluidic device of claim 1,
    wherein the first constituent member has a first substrate and a second substrate;
    wherein the first channel has a first inside channel portion formed inside the first substrate and a second inside channel portion formed inside the second substrate,
    the second inside channel portion having an introduction channel for introducing a fluid into the first inside channel portion, and a discharge channel for discharging a fluid from the first inside channel portion; and
    wherein the first part channel and the introduction channel are connected to each other, and the discharge channel and the second part channel are connected to each other.

7. The fluidic device of claim 1, wherein the first constituent member has a first substrate and a second substrate;
    wherein a recess portion is formed on at least one of two mutually opposing surfaces of the first substrate and the second substrate;
    wherein the first channel has a channel-portion-between-substrates constituted by the recess portion between the first substrate and the second substrate, and a second inside channel portion formed inside the second substrate;
    the second inside channel portion having an introduction channel for introducing a fluid into the channel-portion-between-substrates, and a discharge channel for discharging a fluid from the channel-portion-between-substrates; and
    wherein the first part channel and the introduction channel are connected to each other, and the discharge channel and the second part channel are connected to each other.

8. The fluidic device of claim 6, further comprising a second bonding portion for bonding the first substrate and the second substrate to each other,
    the second bonding portion having a third bonding member and a fourth bonding member,
    wherein the first bonding portion bonds the second substrate and the mounting substrate to each other,
    the third bonding member internally has a channel for connecting the introduction channel and the first inside channel portion to each other; and
    the fourth bonding member internally has a channel for connecting the discharge channel and the first inside channel portion to each other.

9. The fluidic device of claim 7, further comprising a second bonding portion for bonding the first substrate and the second substrate to each other,
    the second bonding portion having a ring-shaped third bonding member, wherein the first bonding portion bonds the second substrate and the mounting substrate to each other; and
the third bonding member is formed so as to enclose the channel-portion-between-substrates.

10. The fluidic device of claim 1,
wherein the first constituent member has a first substrate and a second substrate,
the fluidic device further comprising:
a second bonding portion for bonding the second substrate and the first substrate,
the second bonding portion having a ring-shaped third bonding member,
wherein the first channel has a channel-portion-between-substrates constituted by a gap between the second substrate and the first substrate inside the third bonding member, and a second inside channel portion formed inside the second substrate,
the second inside channel portion having an introduction channel for introducing a fluid into the first inside channel portion, and a discharge channel for discharging a fluid from the first inside channel portion, and
wherein the first bonding portion bonds the second substrate and the mounting substrate to each other.

11. The fluidic device of claim 1, further comprising a first electrically connecting portion for electrically connecting the first constituent member and the mounting substrate to each other.

12. The fluidic device of claim 6, further comprising a first electrically connecting portion for electrically connecting the mounting substrate and a second substrate to each other, and a second electrically connecting portion for electrically connecting the second substrate and the first substrate to each other.

13. The fluidic device of claim 7, further comprising a first electrically connecting portion for electrically connecting the mounting substrate and a second substrate to each other, and a second electrically connecting portion for electrically connecting the second substrate and the first substrate to each other.

14. The fluidic device of claim 1, further comprising a first electrically connecting portion for electrically connecting the first constituent member and the mounting substrate, wherein the first bonding portion is integrated with the first electrically connecting portion.

15. The fluidic device of claim 8, further comprising a first electrically connecting portion for electrically connecting the mounting substrate and the second substrate, and a second electrically connecting portion for electrically connecting the second substrate and the first substrate,
wherein the first bonding portion is integrated with the first electrically connecting portion, and the second bonding portion is integrated with the second electrically connecting portion.

16. The fluidic device of claim 9, further comprising a first electrically connecting portion for electrically connecting the mounting substrate and the second substrate, and a second electrically connecting portion for electrically connecting the second substrate and the first substrate, wherein the first bonding portion is integrated with the first electrically connecting portion, and the second bonding portion is integrated with the second electrically connecting portion.

17. The fluidic device of claim 10, further comprising a first electrically connecting portion for electrically connecting the mounting substrate and the second substrate, and a second electrically connecting portion for electrically connecting the second substrate and the first substrate, wherein the first bonding portion is integrated with the first electrically connecting portion, and the second bonding portion is integrated with the second electrically connecting portion.

18. The fluidic device of claim 1, further comprising a first electrically connecting portion for electrically connecting the first constituent member and the mounting substrate, wherein the first electrically connecting portion is disposed closer to an outer peripheral portion than the first bonding portion.

19. The fluidic device of claim 8, further comprising a first electrically connecting portion for electrically connecting the mounting substrate and the second substrate, and a second electrically connecting portion for electrically connecting the second substrate and the first substrate,
wherein the first electrically connecting portion is disposed closer to an outer peripheral portion than the first bonding portion, and the second electrically connecting portion is disposed closer to an outer peripheral portion than the second bonding portion.

20. The fluidic device of claim 9, further comprising a first electrically connecting portion for electrically connecting the mounting substrate and the second substrate, and a second electrically connecting portion for electrically connecting the second substrate and the first substrate, wherein the first electrically connecting portion is disposed closer to an outer peripheral portion than the first bonding portion, and the second electrically connecting portion is disposed closer to an outer peripheral portion than the second bonding portion.

21. The fluidic device of claim 10, further comprising a first electrically connecting portion for electrically connecting the mounting substrate and the second substrate, and a second electrically connecting portion for electrically connecting the second substrate and the first substrate, wherein the first electrically connecting portion is disposed closer to an outer peripheral portion than the first bonding portion, and the second electrically connecting portion is disposed closer to an outer peripheral portion than the second bonding portion.

22. The fluidic device of claim 8, wherein the second bonding portion is disposed closer to an outer peripheral portion than the first bonding portion when viewed from a plain surface.

23. The fluidic device of claim 9, wherein the second bonding portion is disposed closer to an outer peripheral portion than the first bonding portion when viewed from a plain surface.

24. A detecting method for detecting a component in the fluid using the fluid device of claim 5 comprising:
a storage step of storing a fluid of interest which is subjected to detection;
a fluid feeding step of feeding the stored fluid of interest;
a detection step of detecting a predetermined component in the fluid of interest; and
a collection step of collecting the fluid of interest having been subjected to detection.

* * * * *